(12) United States Patent
Wang et al.

(10) Patent No.: US 11,638,937 B2
(45) Date of Patent: May 2, 2023

(54) METHODS AND APPARATUS FOR CLEANING SUBSTRATES

(71) Applicant: ACM Research (Shanghai) Inc., Shanghai (CN)

(72) Inventors: Hui Wang, Fremont, CA (US); Xi Wang, Shanghai (CN); Fuping Chen, Shanghai (CN); Fufa Chen, Cupertino, CA (US); Jian Wang, Shanghai (CN); Xiaoyan Zhang, Shanghai (CN); Yinuo Jin, Shanghai (CN); Zhaowei Jia, Shanghai (CN); Jun Wang, Shanghai (CN); Xuejun Li, Shanghai (CN)

(73) Assignee: ACM RESEARCH, INC., Shanghai (CN)

(*) Notice: Subject to any disclaimer, the term of this patent is extended or adjusted under 35 U.S.C. 154(b) by 0 days.

(21) Appl. No.: 17/378,096

(22) Filed: Jul. 16, 2021

(65) Prior Publication Data
US 2022/0032344 A1 Feb. 3, 2022

Related U.S. Application Data

(62) Division of application No. 16/334,703, filed as application No. PCT/CN2016/099303 on Sep. 19, 2016, now Pat. No. 11,103,898.

(51) Int. Cl.
*B08B 3/12* (2006.01)
*B06B 1/02* (2006.01)
(Continued)

(52) U.S. Cl.
CPC ............ *B08B 3/123* (2013.01); *B06B 1/0269* (2013.01); *B06B 1/0284* (2013.01);
(Continued)

(58) Field of Classification Search
CPC ......... H01L 21/67051; H01L 21/67057; H01L 21/67253; H01L 21/02068; H01L 21/68;
(Continued)

(56) References Cited

U.S. PATENT DOCUMENTS

| 5,931,173 A | 8/1999 | Schiele |
| 7,040,330 B2 * | 5/2006 | Boyd ................. H01L 21/67057 156/345.55 |

(Continued)

FOREIGN PATENT DOCUMENTS

| CN | 101087007 A | 12/2007 |
| CN | 101879511 A | 11/2010 |

(Continued)

OTHER PUBLICATIONS

International Search Report and Written Opinion for International PCT Application No. PCT/CN2016/099303, dated Jun. 9, 2017.

(Continued)

*Primary Examiner* — Christopher Remavege
(74) *Attorney, Agent, or Firm* — K&L Gates LLP

(57) ABSTRACT

A method for effectively cleaning vias (20034), trenches (20036) or recessed areas on a substrate (20010) using an ultra/mega sonic device (1003, 3003, 16062, 17072), comprising: applying liquid (1032) into a space between a substrate (20010) and an ultra/mega sonic device (1003, 3003, 16062, 17072); setting an ultra/mega sonic power supply at frequency $f_1$ and power $P_1$ to drive said ultra/mega sonic device (1003, 3003, 16062, 17072); after the ratio of total bubbles volume to volume inside vias (20034), trenches (20036) or recessed areas on the substrate (20010) increasing to a first set value, setting said ultra/mega sonic power supply at frequency $f_2$ and power $P_2$ to drive said ultra/mega sonic device (1003, 3003, 16062, 17072); after the ratio of total bubbles volume to volume inside the vias (Continued)

(20034), trenches (20036) or recessed areas reducing to a second set value, setting said ultra/mega sonic power supply at frequency $f_1$ and power $P_1$ again; repeating above steps till the substrate (20010) being cleaned.

52 Claims, 26 Drawing Sheets

(51) Int. Cl.
 B06B 1/06 (2006.01)
 H01L 21/02 (2006.01)
 H01L 21/67 (2006.01)
(52) U.S. Cl.
 CPC .............. B06B 1/0644 (2013.01); B08B 3/12 (2013.01); H01L 21/02063 (2013.01); H01L 21/67057 (2013.01); B06B 2201/71 (2013.01); B08B 2203/007 (2013.01)
(58) Field of Classification Search
 CPC ............. H01L 21/687; H01L 21/02041; H01L 21/02307; H01L 21/67028; H01L 21/67098; H01L 21/67248
 See application file for complete search history.

(56) References Cited

U.S. PATENT DOCUMENTS

| | | | |
|---|---|---|---|
| 7,247,977 B2 | 7/2007 | Goodson | |
| 7,306,002 B2 | 12/2007 | Kim et al. | |
| 7,310,131 B2 | 12/2007 | Jasper | |
| 7,495,371 B2 | 2/2009 | Goodson | |
| 7,598,654 B2 | 10/2009 | Goodson | |
| 8,202,369 B2 | 6/2012 | Holsteyns et al. | |
| 8,936,032 B2 | 1/2015 | Goodson | |
| 9,044,794 B2 | 6/2015 | Holsteyns et al. | |
| 9,070,722 B2 | 6/2015 | Fan | |
| 9,159,311 B2 | 10/2015 | Goodson | |
| 9,975,151 B2 | 5/2018 | Kim et al. | |
| 2001/0013355 A1 | 8/2001 | Busnaina | |
| 2002/0195133 A1 | 12/2002 | Miranda et al. | |
| 2005/0017599 A1 | 1/2005 | Puskas | |
| 2006/0260641 A1 | 11/2006 | Wu et al. | |
| 2006/0278253 A1 | 12/2006 | Verhaverbeke et al. | |
| 2007/0088481 A1 | 4/2007 | McCormick | |
| 2007/0267040 A1 | 11/2007 | Watanabe et al. | |
| 2010/0224214 A1 | 9/2010 | Kaneko et al. | |
| 2011/0041871 A1 | 2/2011 | Fan | |
| 2012/0097195 A1 | 4/2012 | Wang et al. | |
| 2014/0216508 A1* | 8/2014 | Korbler | B06B 1/0607 310/334 |

FOREIGN PATENT DOCUMENTS

| | | |
|---|---|---|
| CN | 103736690 A | 4/2014 |
| CN | 203816979 U | 9/2014 |
| CN | 105142808 A | 12/2015 |
| JP | H06296942 A | 10/1994 |
| JP | 2002289565 A | 10/2002 |
| JP | 2007165695 A | 6/2007 |
| JP | 2007326088 A | 12/2007 |
| JP | 2013021160 A | 1/2013 |
| WO | 2018049671 A1 | 3/2018 |

OTHER PUBLICATIONS

International Preliminary Report on Patentability for International PCT Application No. PCT/CN2016/099303, dated Mar. 19, 2019.

* cited by examiner

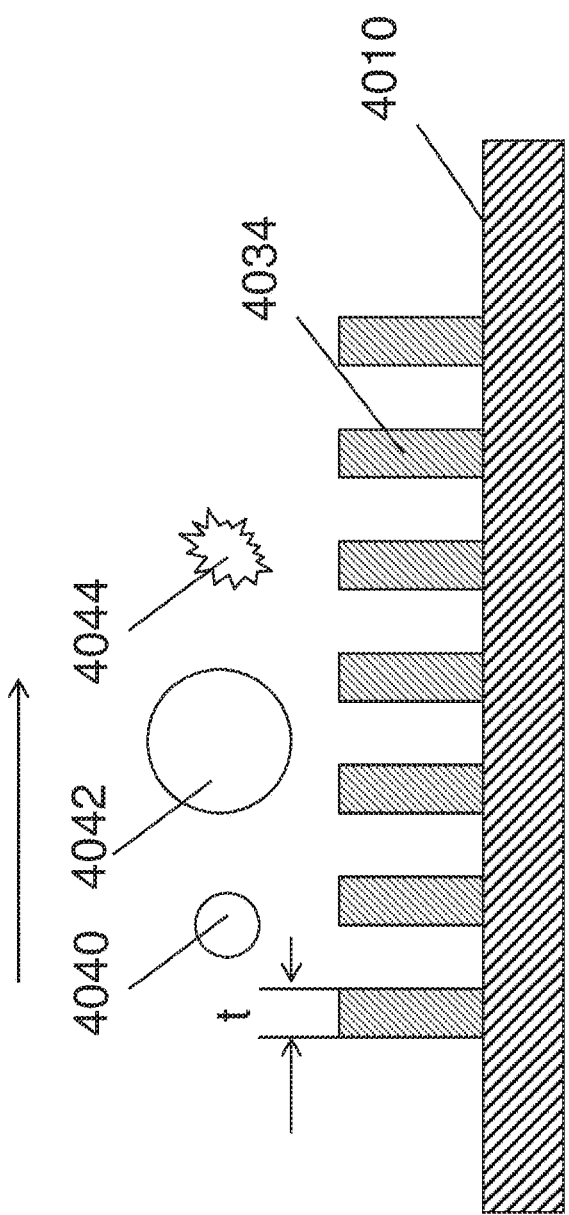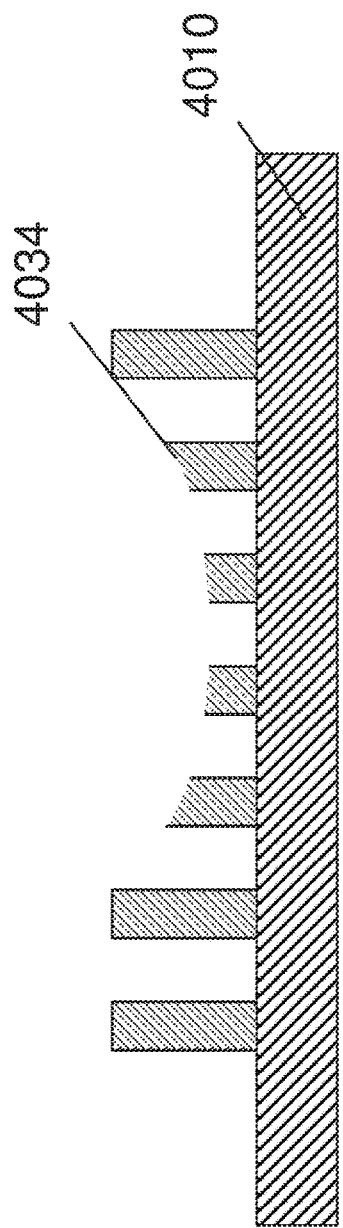
Fig. 4A
Fig. 4B

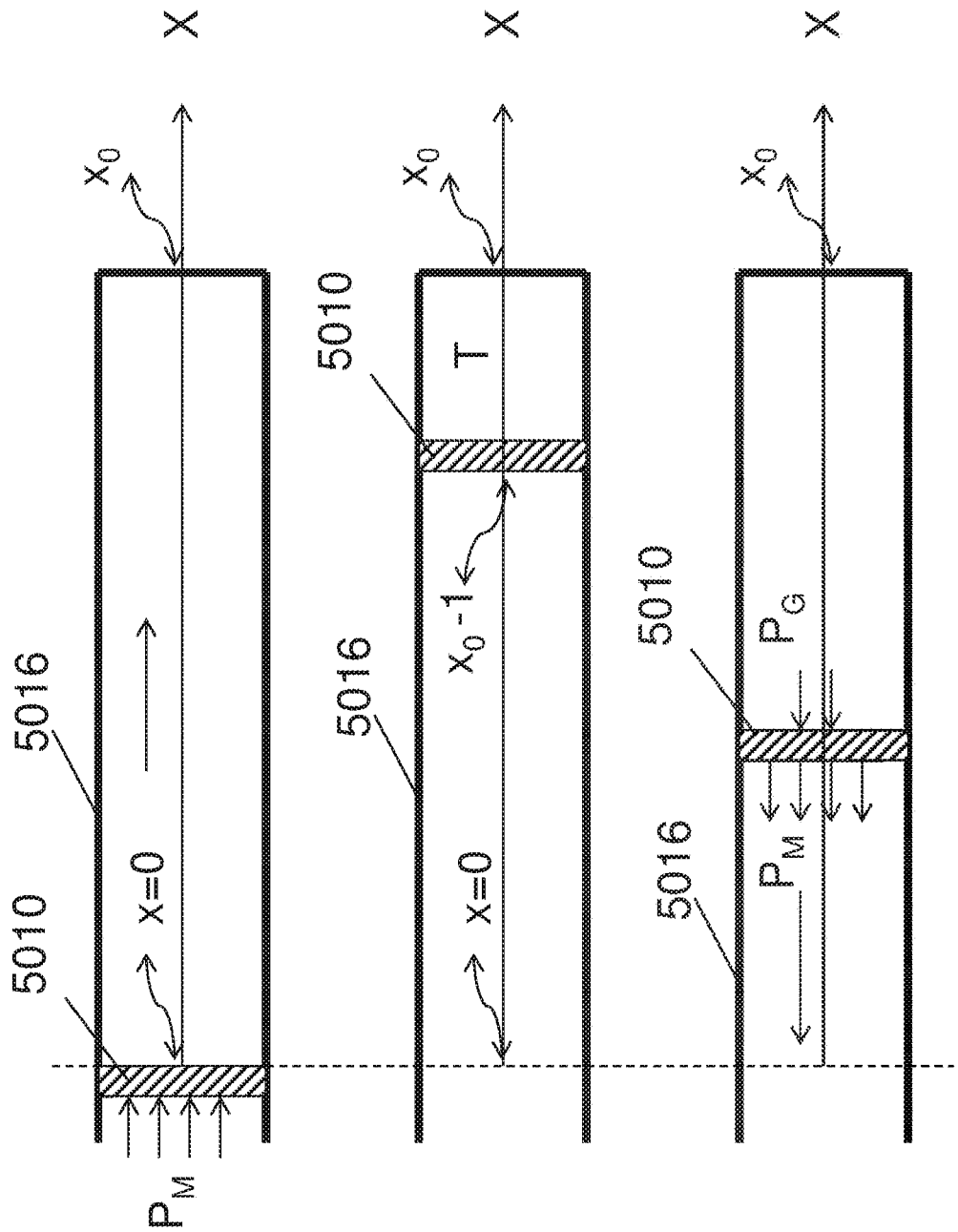

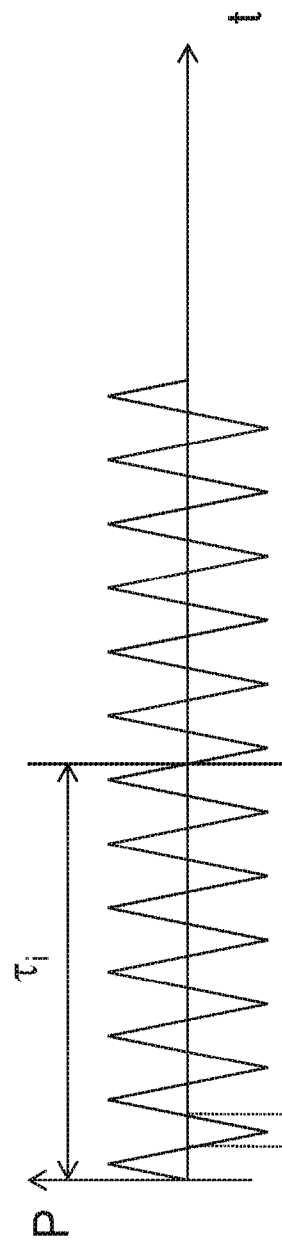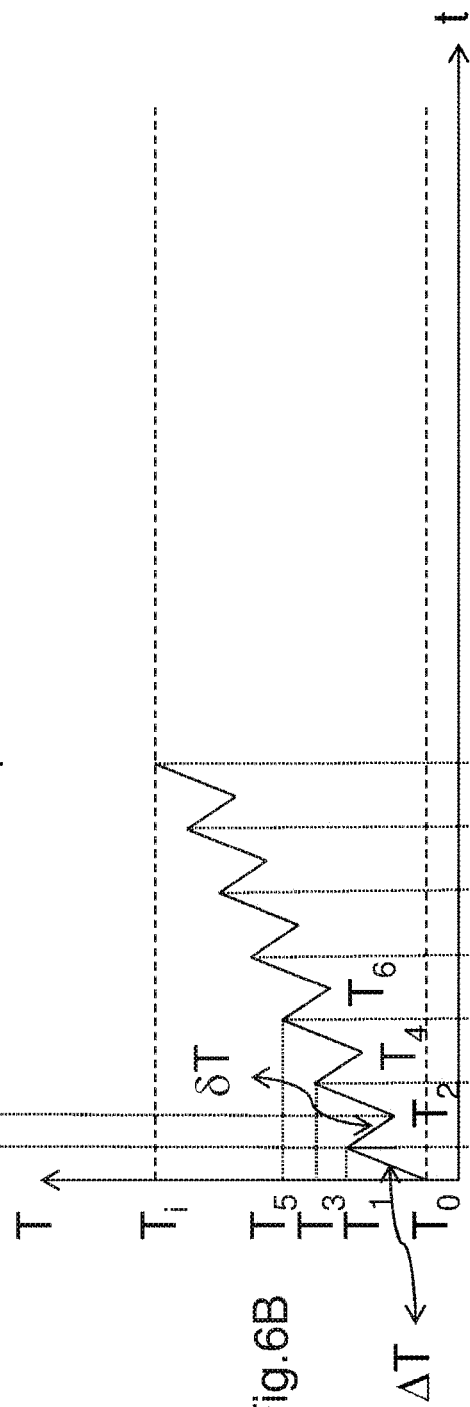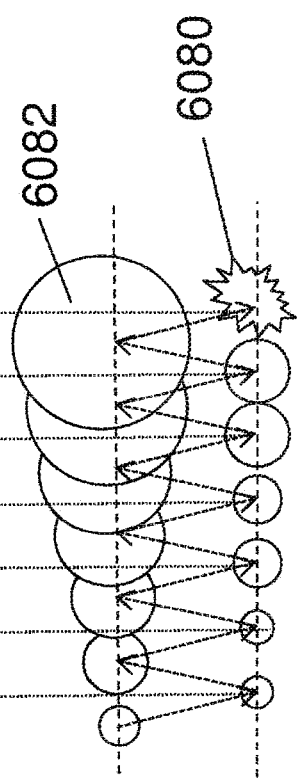

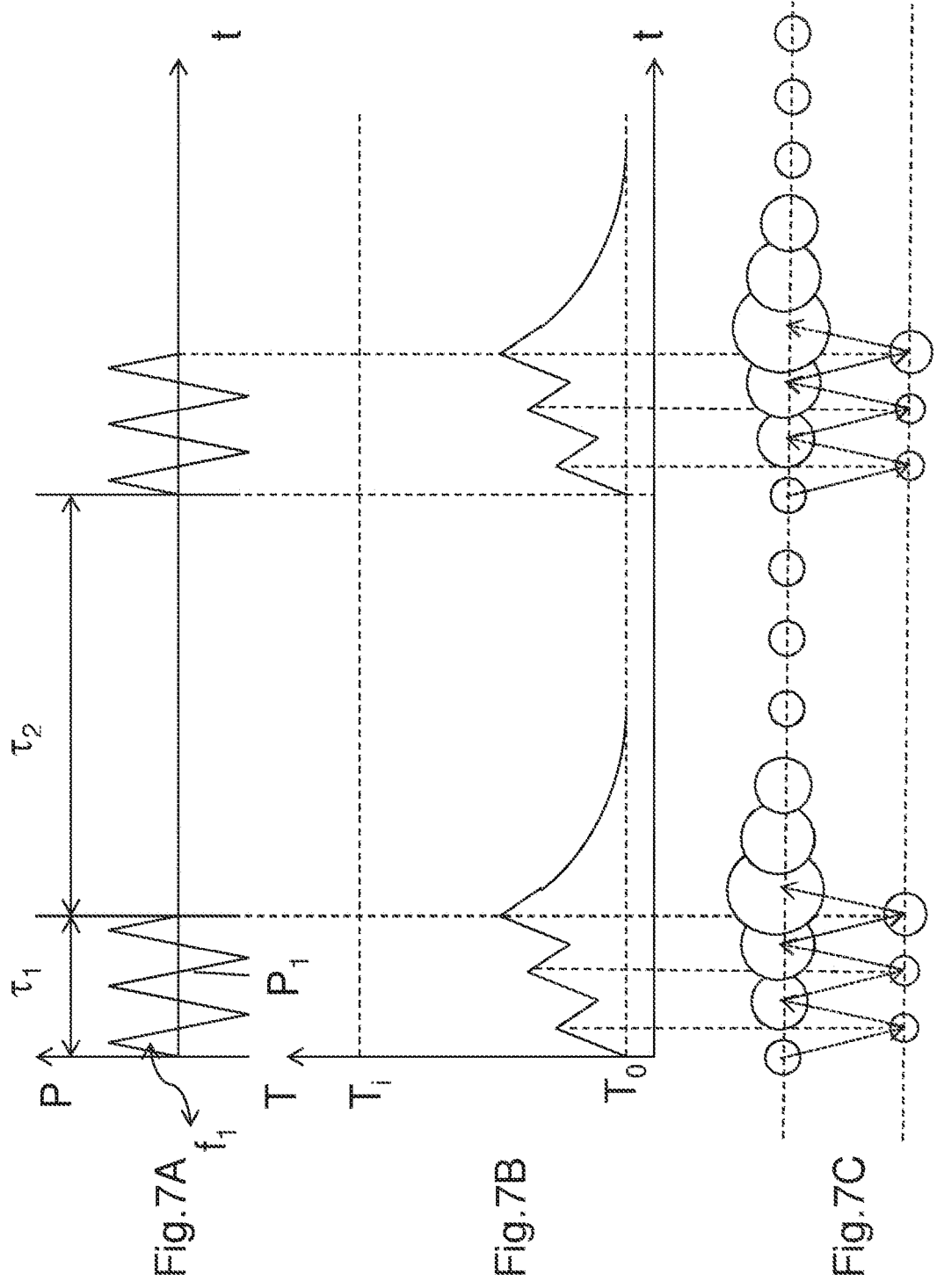

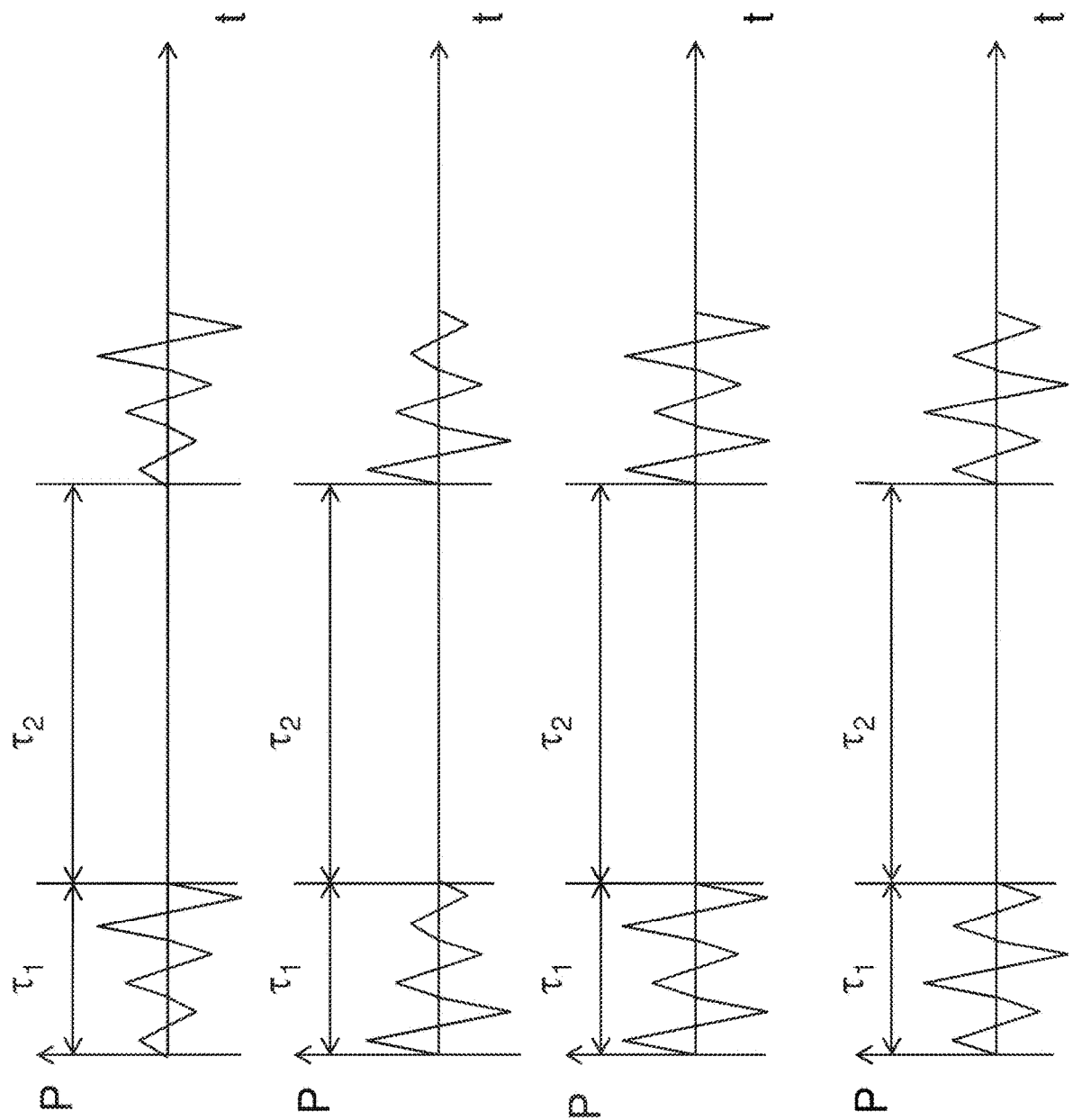

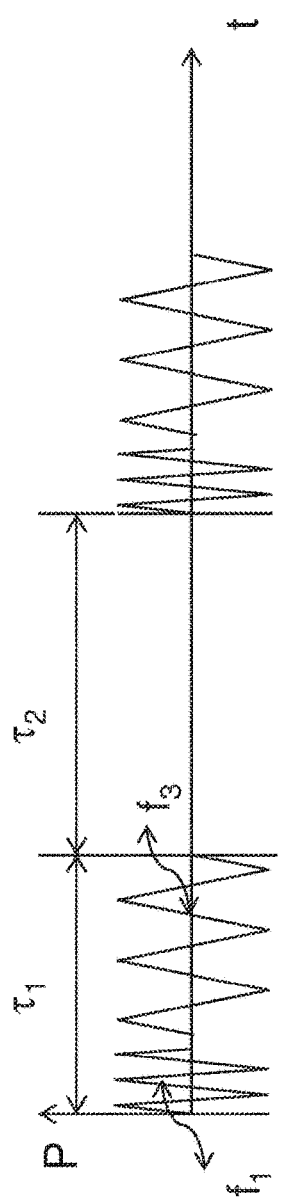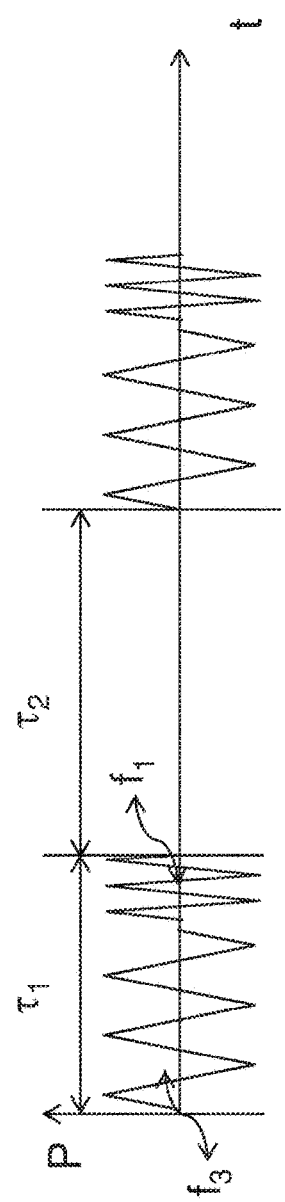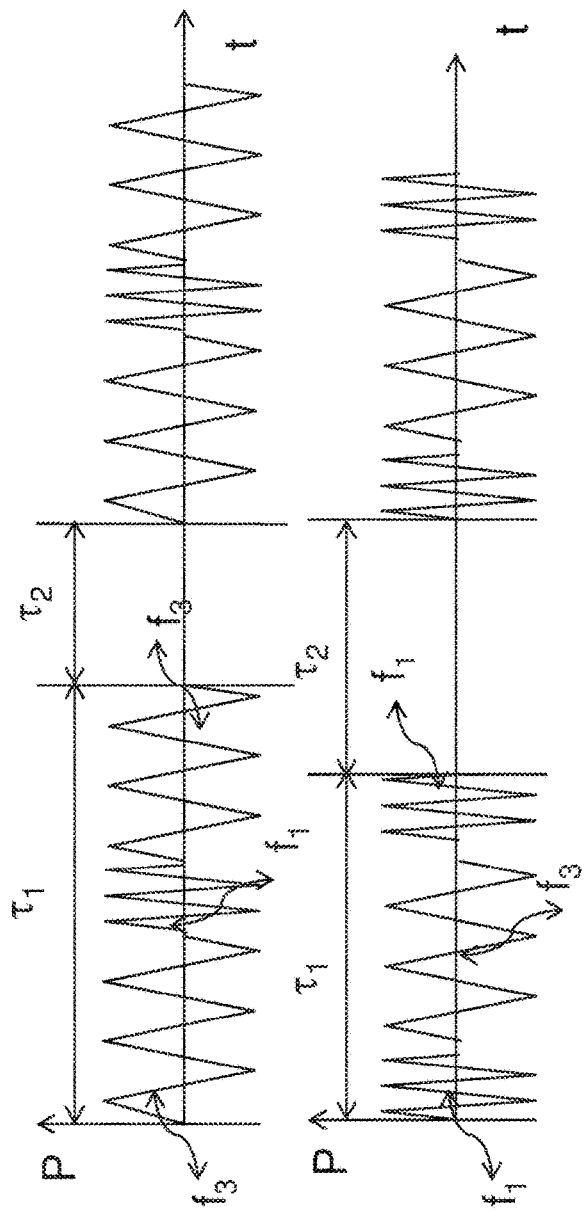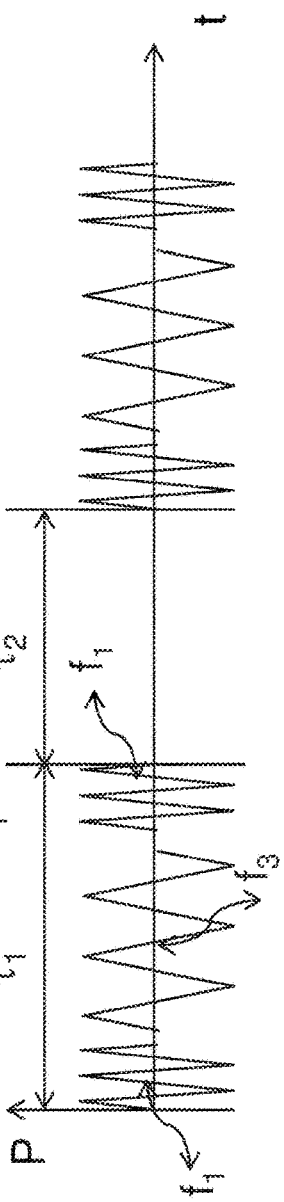

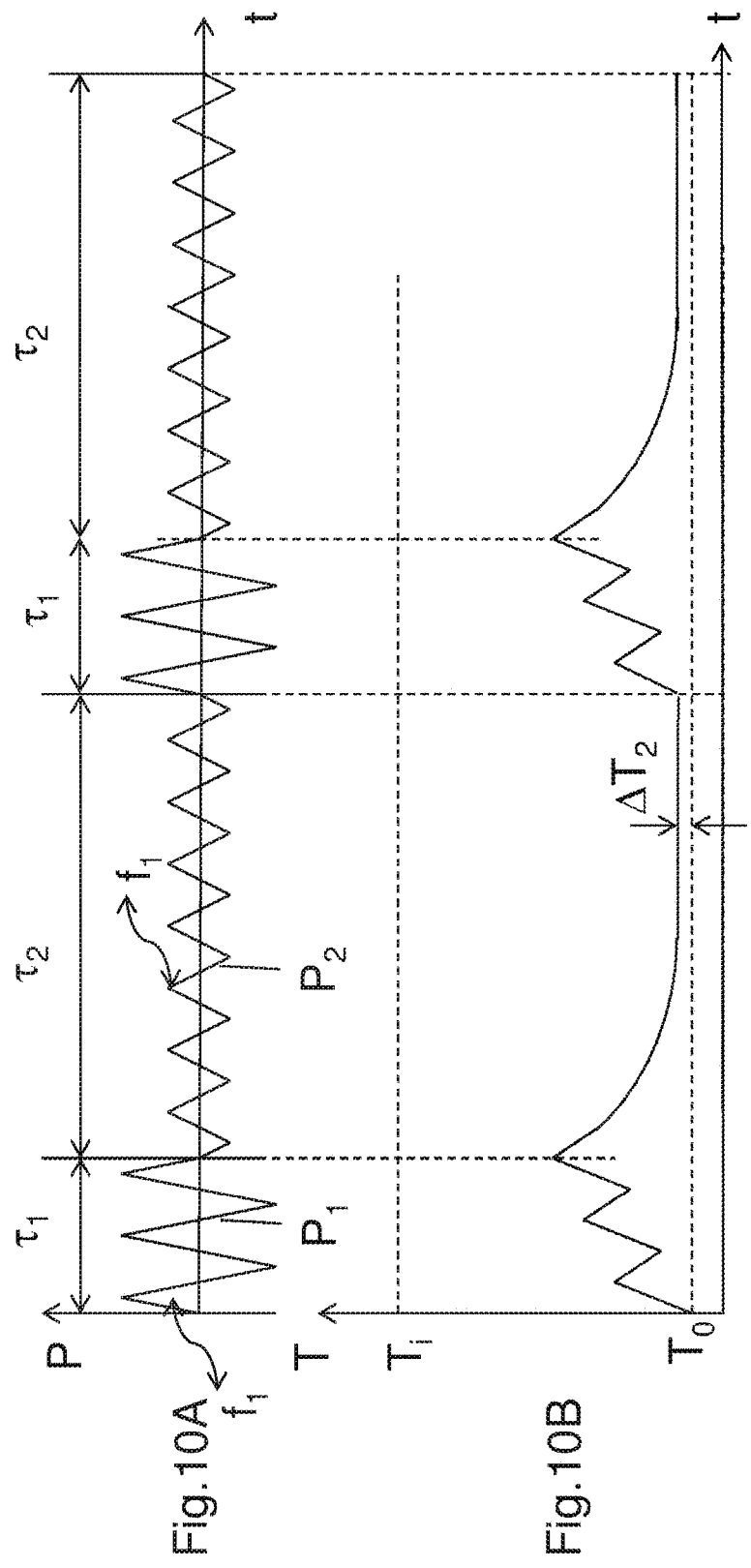

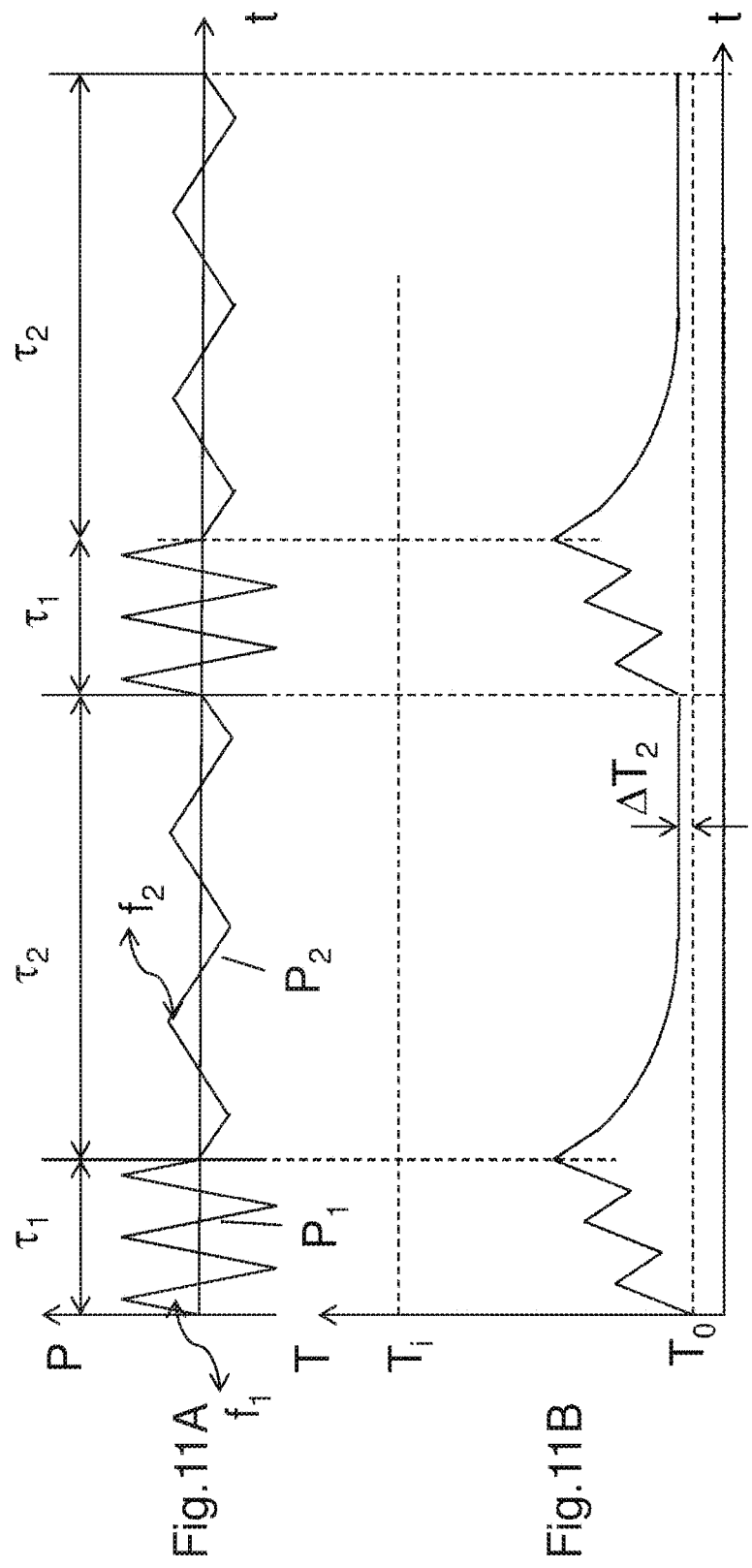

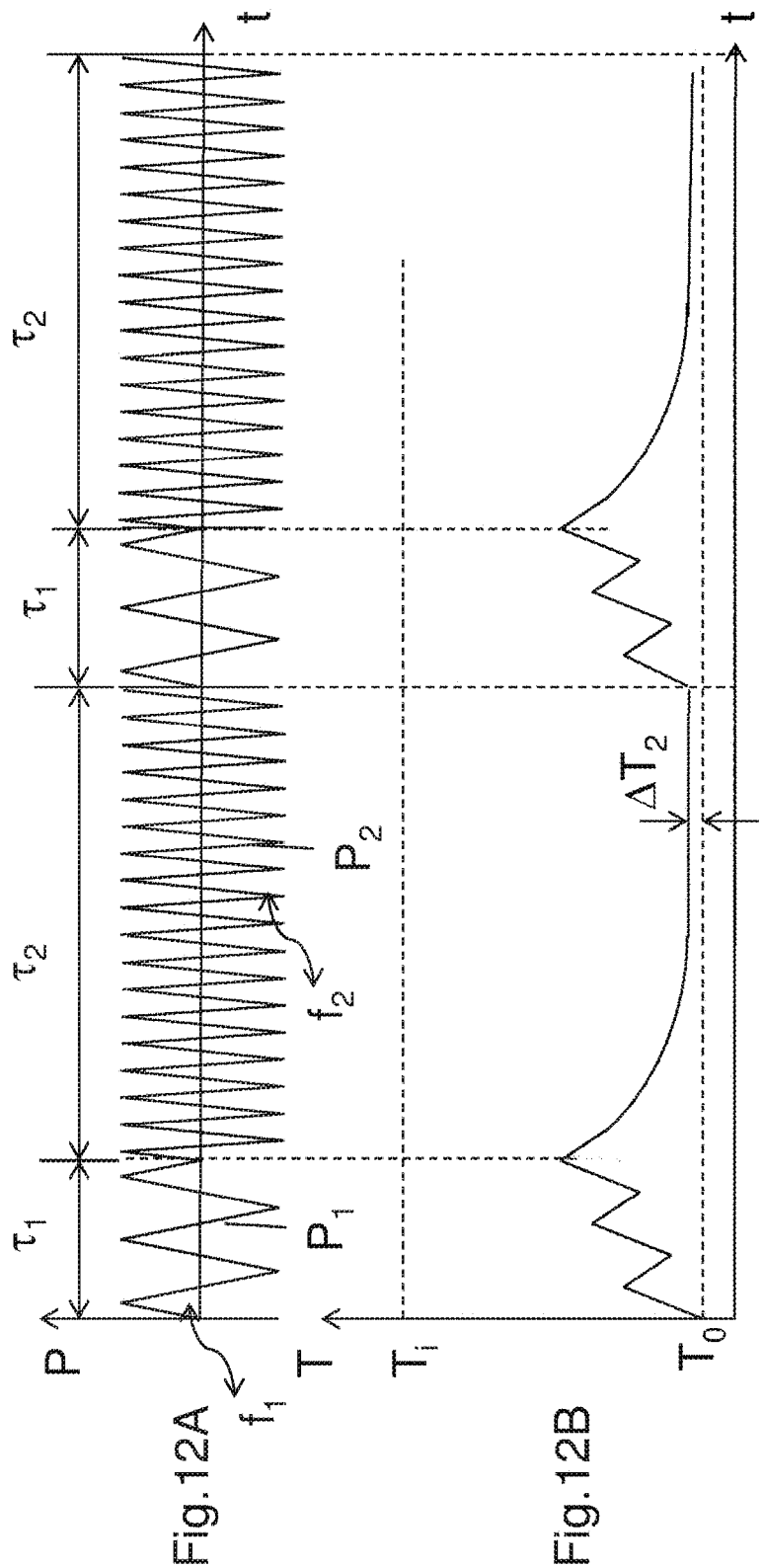

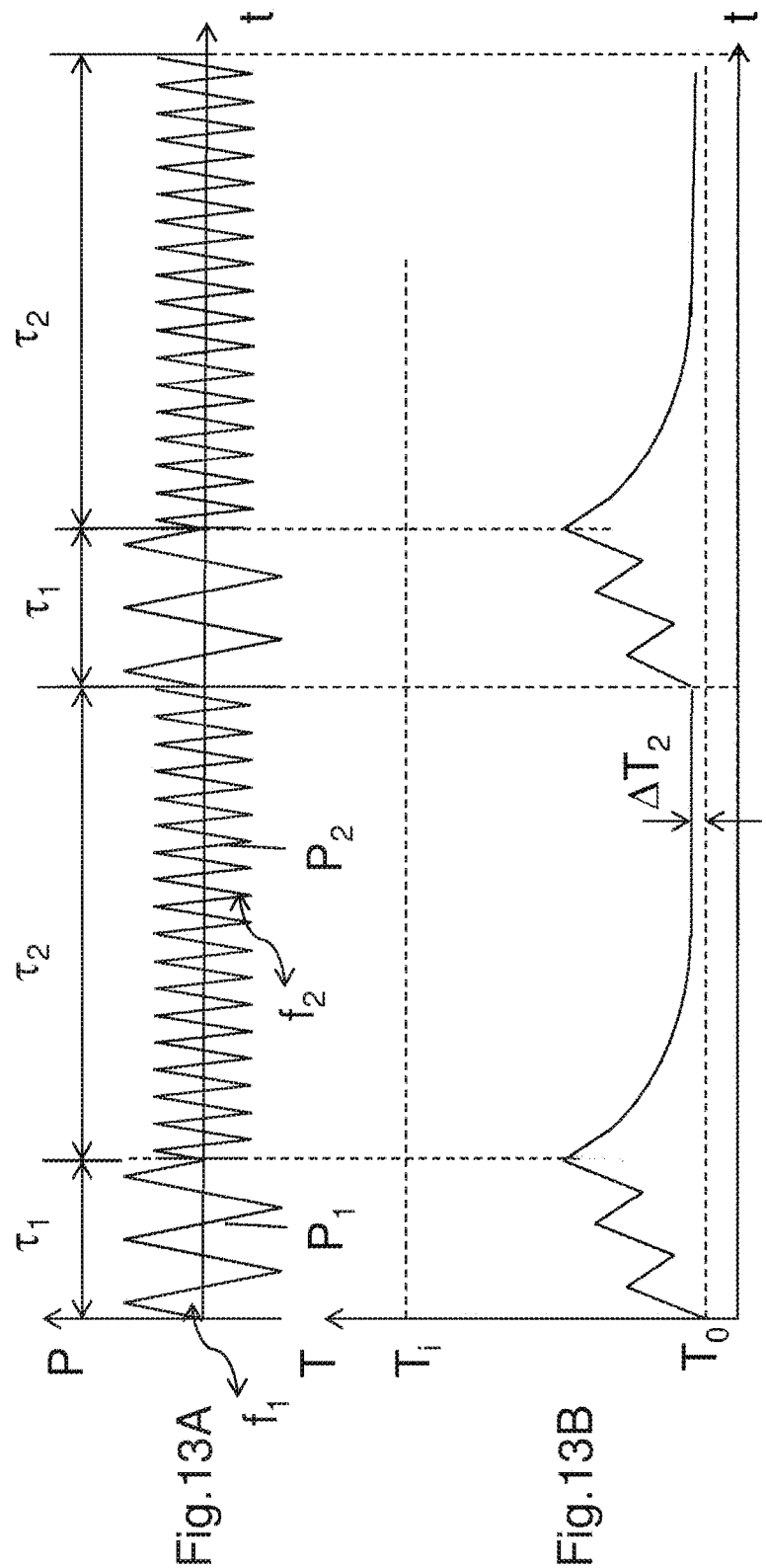

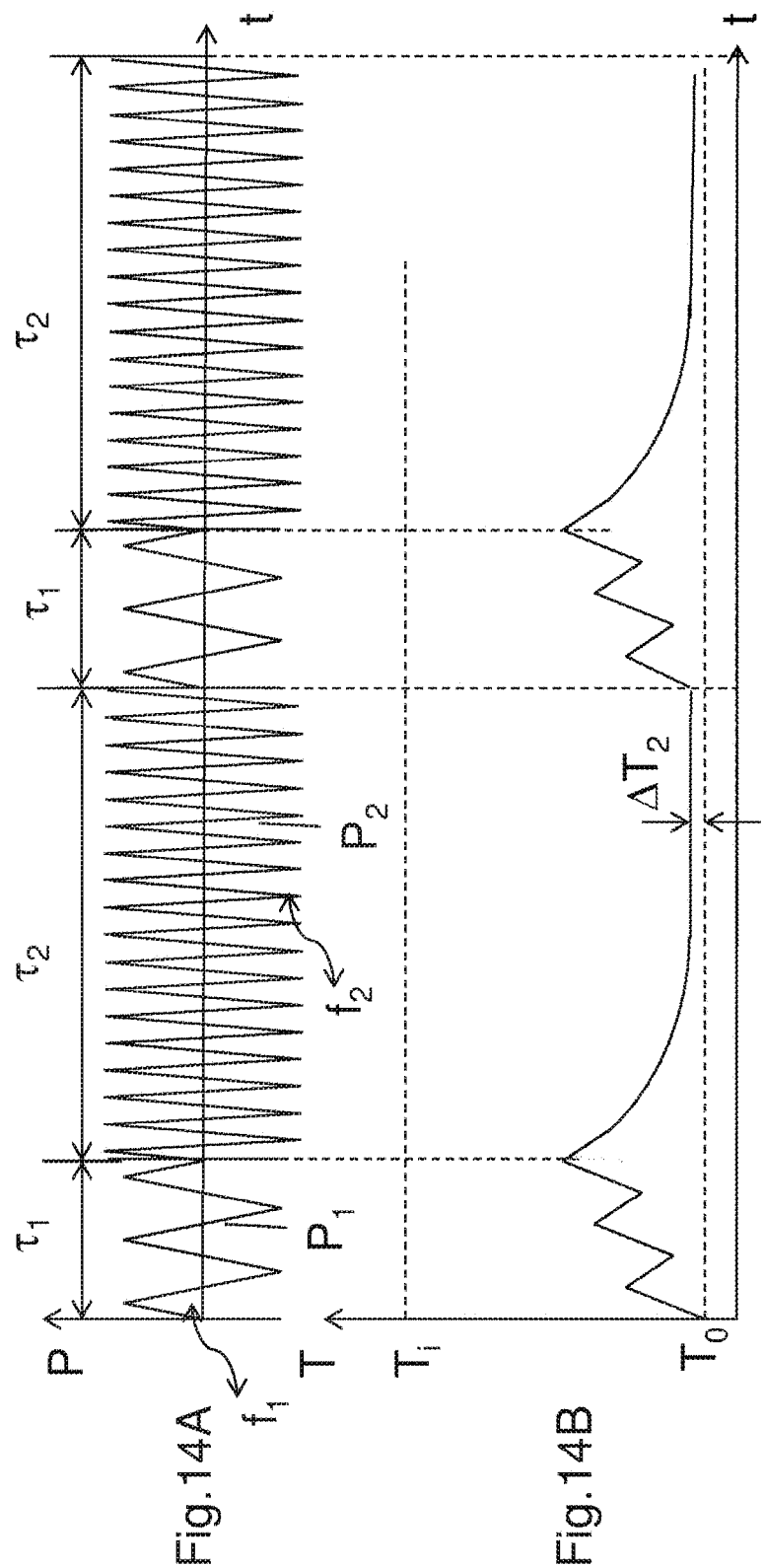

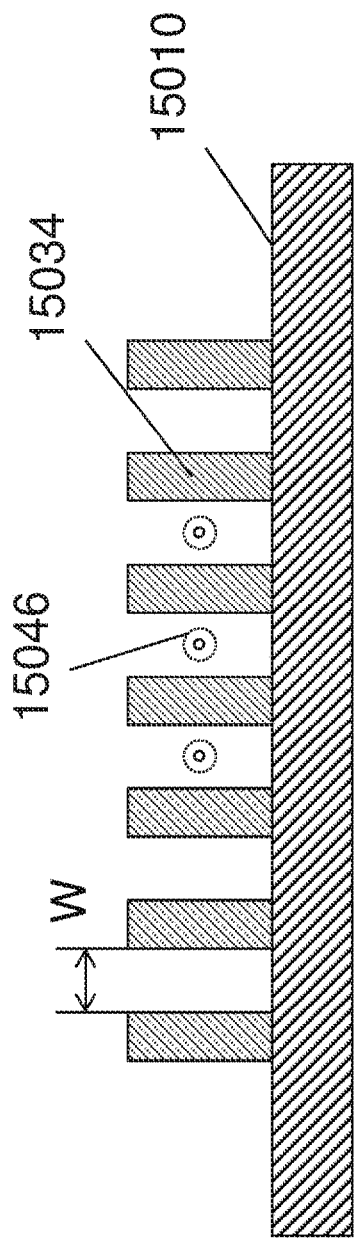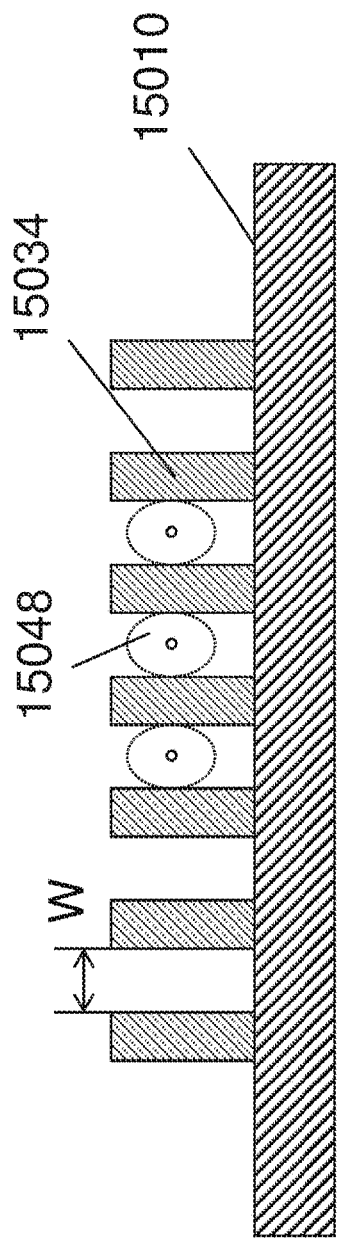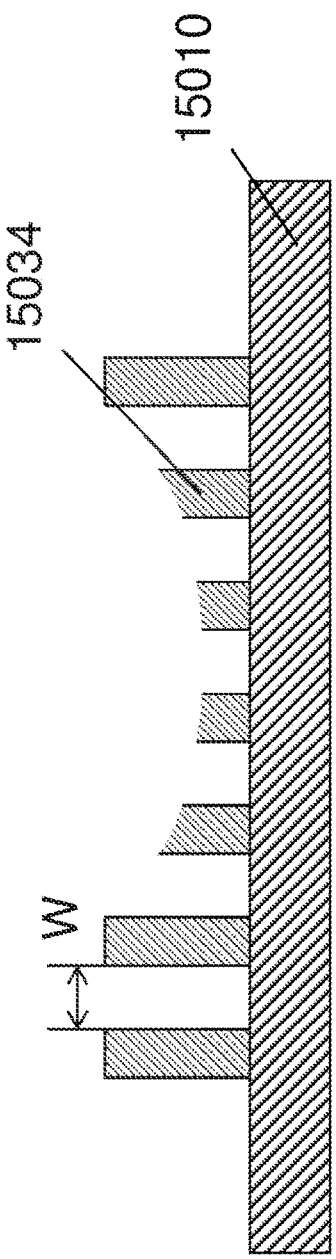

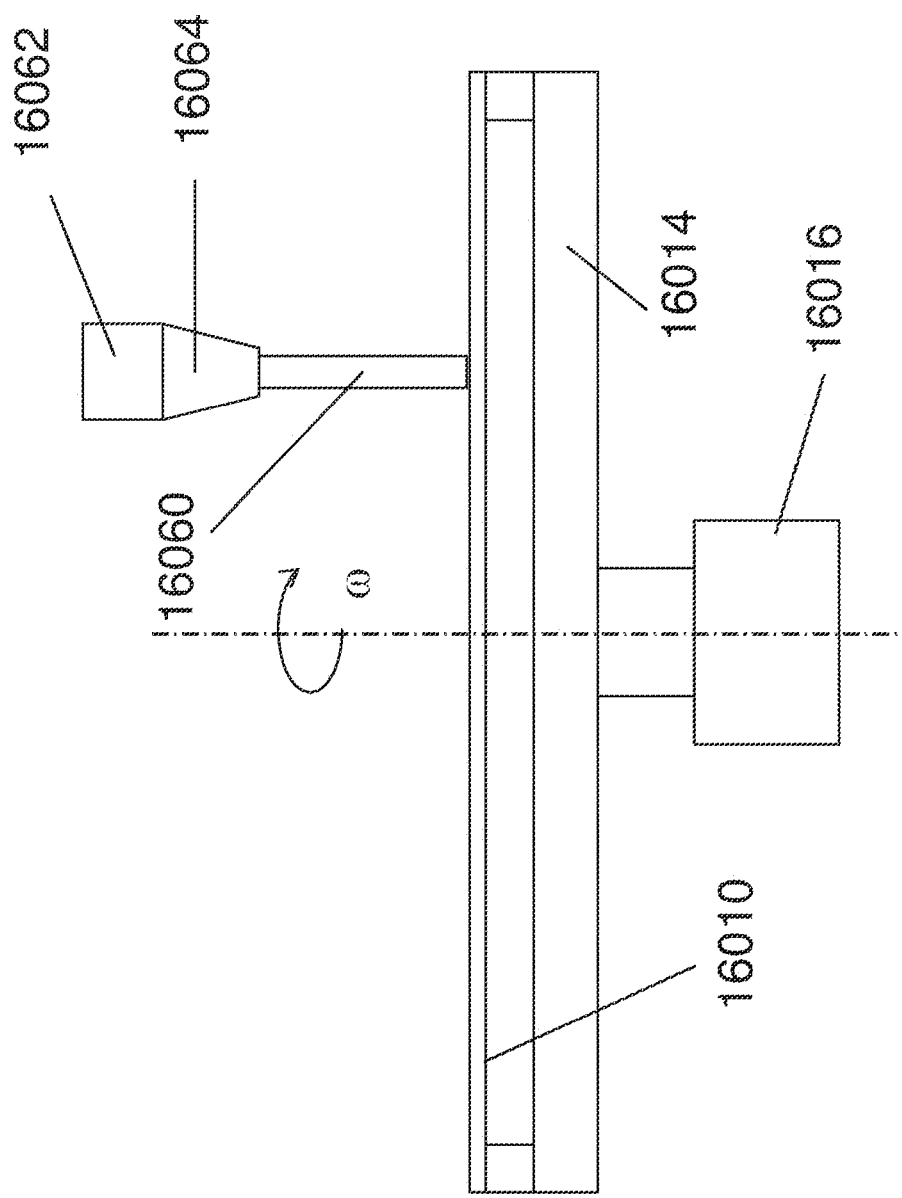

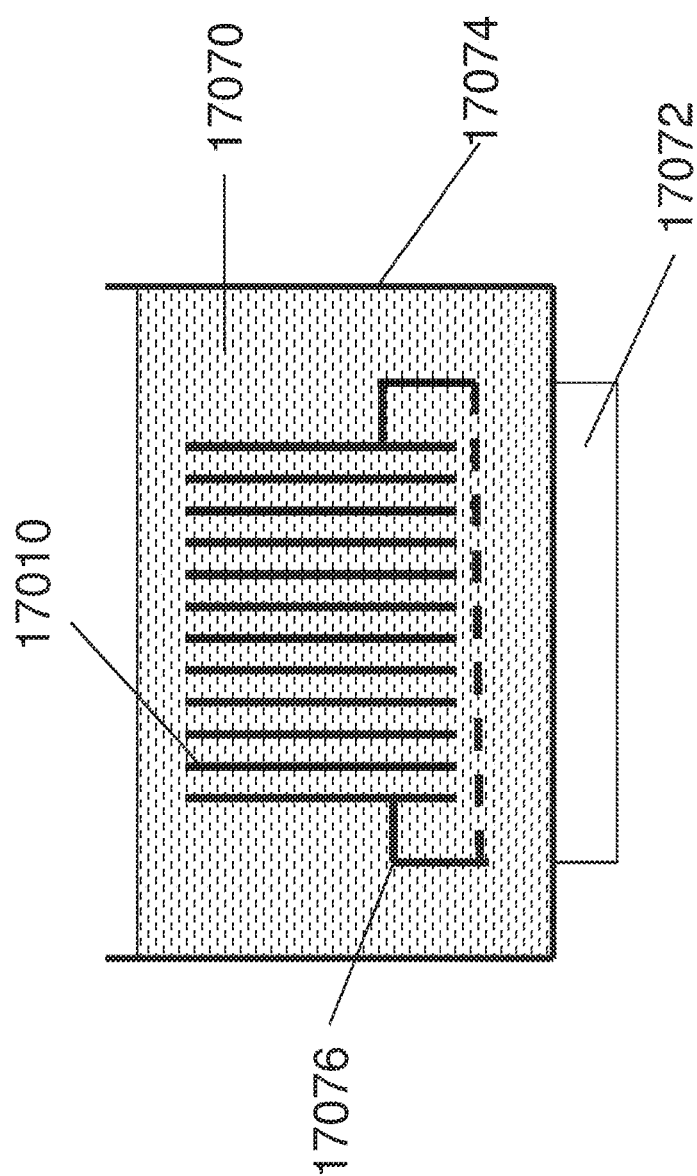

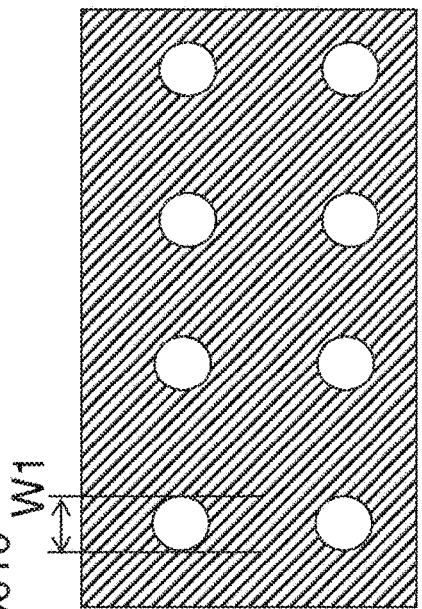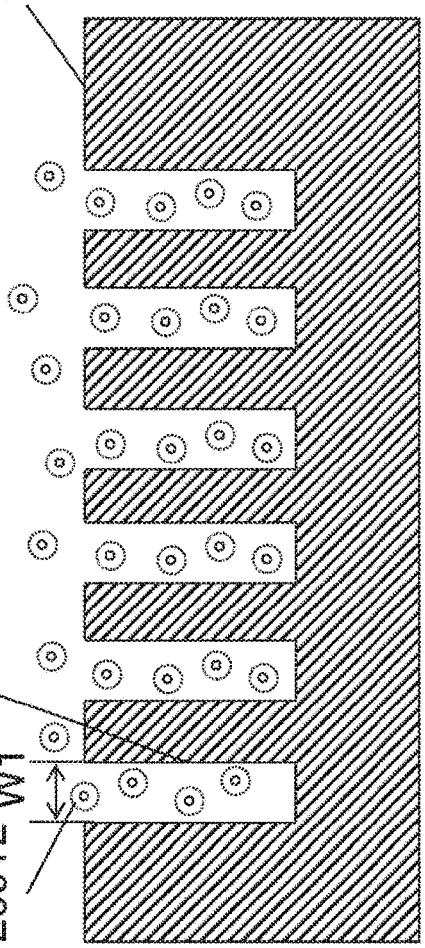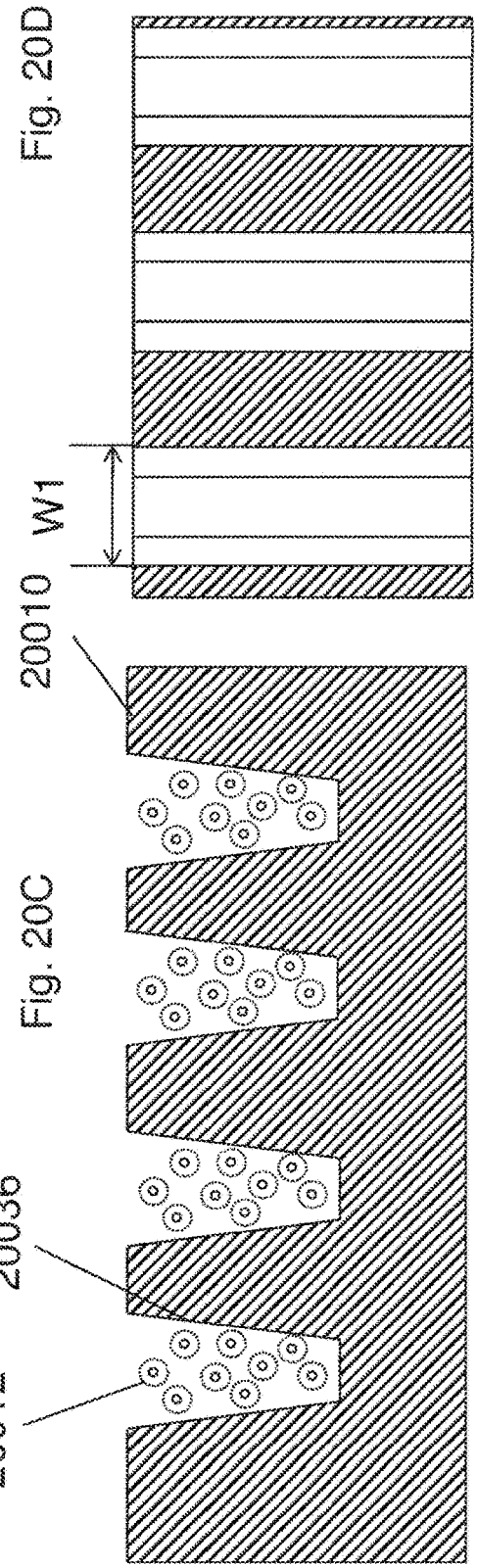

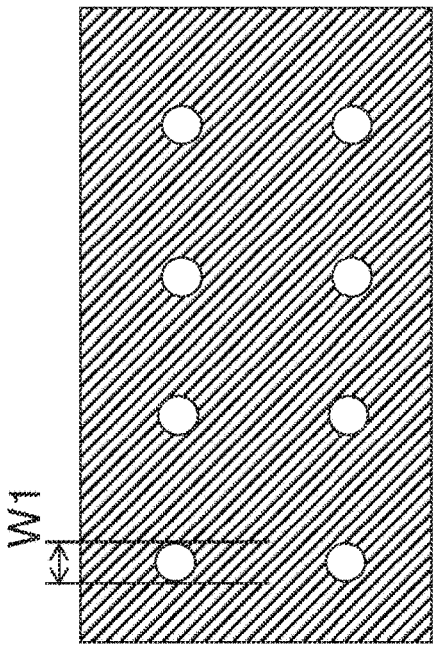
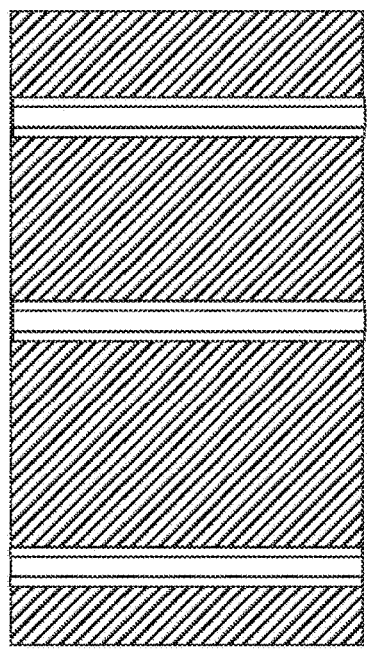
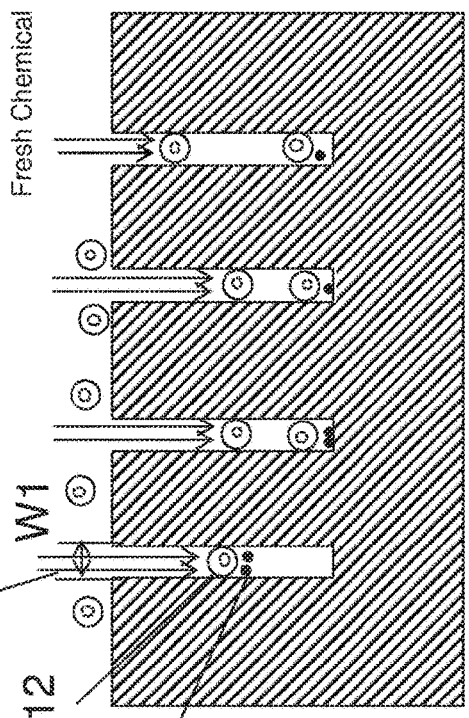
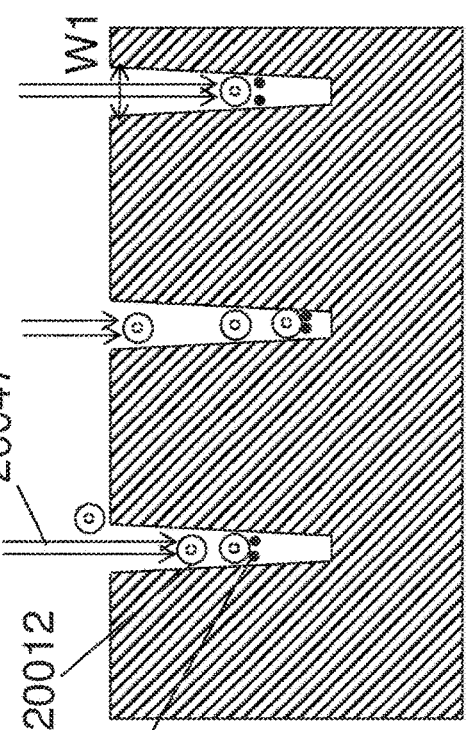

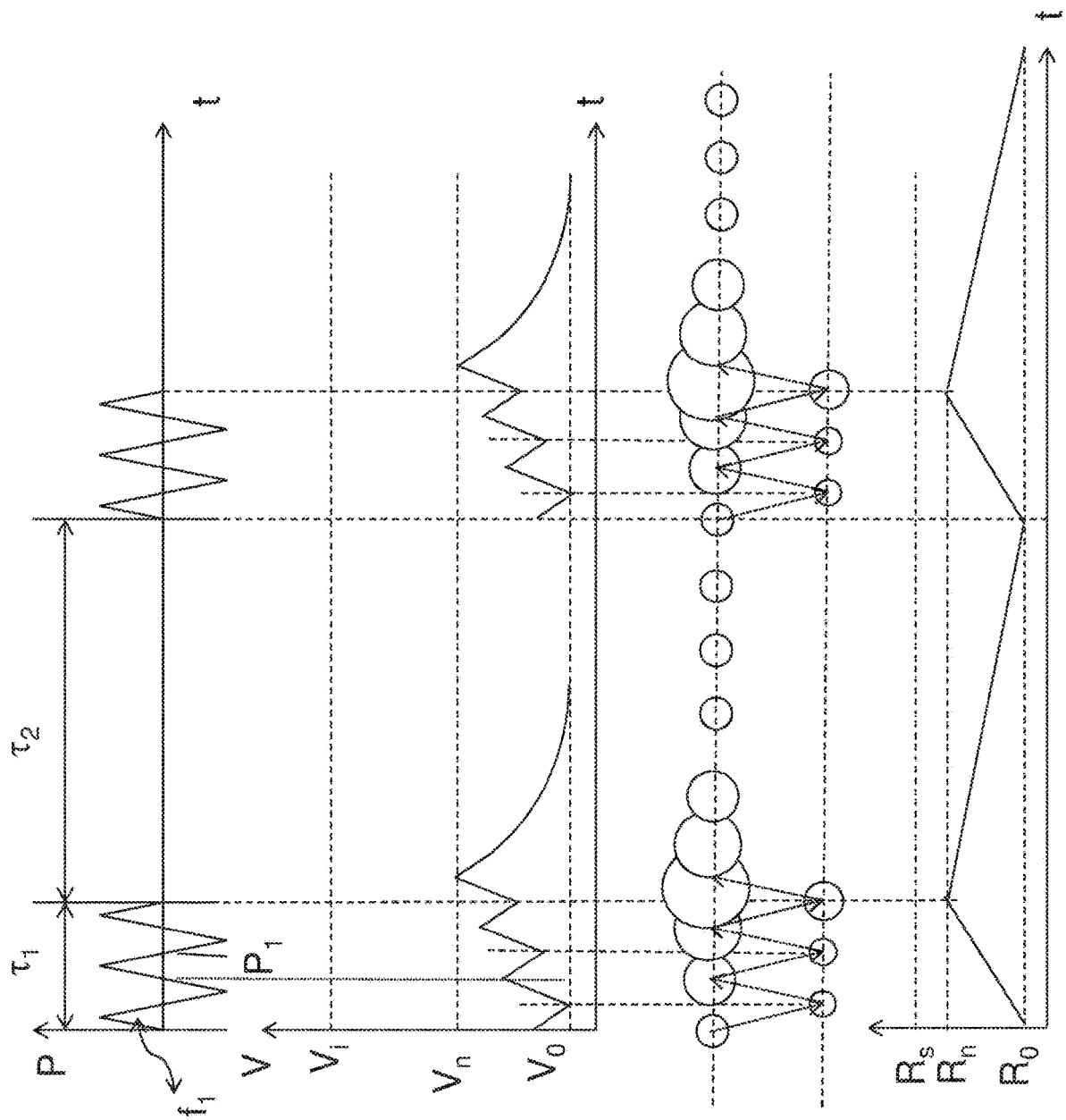

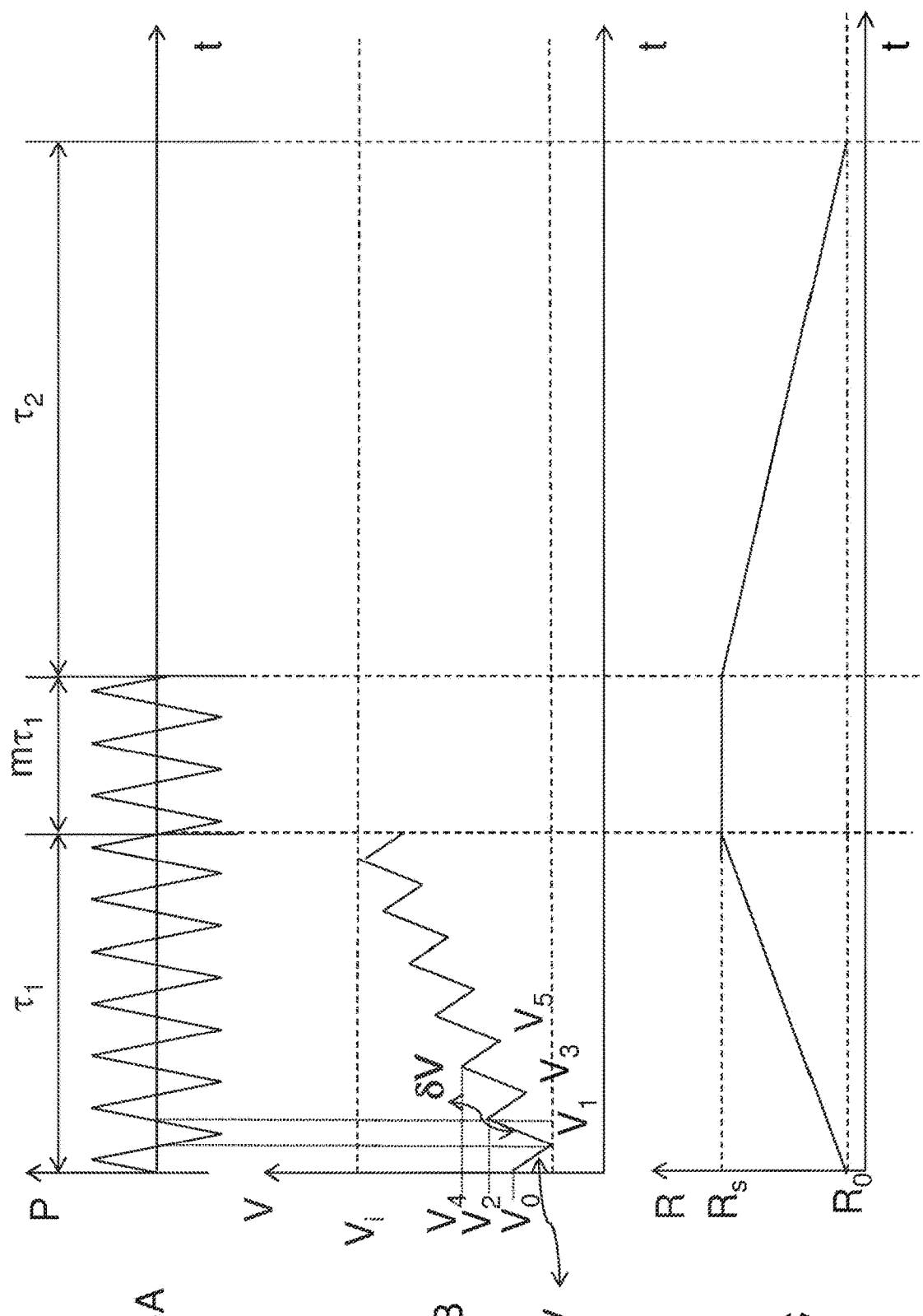

METHODS AND APPARATUS FOR CLEANING SUBSTRATES

CROSS-REFERENCE TO RELATED APPLICATIONS

This application is a divisional application claiming priority under 35 U.S.C. § 120 to U.S. patent application Ser. No. 16/334,703, entitled METHODS AND APPARATUS FOR CLEANING SUBSTRATES, filed Mar. 19, 2019, which is a U.S. National Stage Entry under 35 U.S.C. § 371 of International Patent Application No. PCT/CN2016/0993003, filed Sep. 19, 2016 and titled METHODS AND APPARATUS FOR CLEANING SUBSTRATES, the entire disclosures of which are hereby incorporated by reference herein.

FIELD OF THE INVENTION

The present invention generally relates to method and apparatus for cleaning substrate. More particularly, relates to controlling the bubble cavitation generated by ultra or mega sonic device during the cleaning process to achieve a stable or controlled cavitation on the entire substrate, which removes fine particles efficiently in vias, trenches or recessed areas with high aspect ratio.

BACKGROUND

Semiconductor devices are manufactured or fabricated on semiconductor substrates using a number of different processing steps to create transistor and interconnection elements. Recently, the transistors are built from two dimensions to three dimensions such as finFET transistors and 3D NAND memory. To electrically connect transistor terminals associated with the semiconductor substrate, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the finFET transistors and interconnection elements on the semiconductor substrate may undergo, for example, masking, etching, and deposition processes to form the desired electronic circuitry of the semiconductor devices. In particular, multiple masking and plasma etching step can be performed to form a pattern of finFET, 3D NAND flash cell and or recessed areas in a dielectric layer on a semiconductor substrate that serve as fin for the transistor and or trenches and vias for the interconnection elements. In order to removal particles and contaminations in fin structure and or trench and via post etching or photo resist ashing, a wet cleaning step is necessary. Especially, when device manufacture node migrating to 14 or 16 nm and beyond, the side wall loss in fin and or trench and via is crucial for maintaining the critical dimension. In order to reduce or eliminate the side wall loss, it is important to use moderate, dilute chemicals, or sometime de-ionized water only. However, the dilute chemical or de-ionized water usually is not efficient to remove the particles in the fin structure, 3D NAND hole and or trench and via. Therefore the mechanical force such as ultra or mega sonic is needed in order to remove those particles efficiently. Ultra sonic or mega sonic wave will generate bubble cavitation which applies mechanical force to substrate structure, the violent cavitation such as transit cavitation or micro jet will damage those patterned structures. To maintain a stable or controlled cavitation is key parameters to control the mechanical force within the damage limit and at the same time efficiently to remove the particles. In the 3D NAND hole structure, the transit cavitation may not damage the hole structure, but however, the bubble cavitation saturated inside hole will stop or reduce the cleaning effects.

Mega sonic energy coupled with nozzle to clean semiconductor wafer is disclosed in U.S. Pat. No. 4,326,553. The fluid is pressurized and mega sonic energy is applied to the fluid by a mega sonic transducer. The nozzle is shaped to provide a ribbon-like jet of cleaning fluid vibrating at ultra/mega sonic frequencies for the impingement on the surface.

A source of energy vibrates an elongated probe which transmits the acoustic energy into the fluid is disclosed in U.S. Pat. No. 6,039,059. In one arrangement, fluid is sprayed onto both sides of a wafer while a probe is positioned close to an upper side. In another arrangement, a short probe is positioned with its end surface close to the surface, and the probe is moved over the surface as wafer rotates.

A source of energy vibrates a rod which rotates around it axis parallel to wafer surface is disclosed in U.S. Pat. No. 6,843,257 B2. The rod surface is etched to curve groves, such as spiral groove.

It is needed to have a better method for controlling the bubble cavitation generated by ultra or mega sonic device during the cleaning process to achieve a stable or controlled cavitation on the entire substrate, which removes fine particles efficiently in vias, trenches or recessed areas with high aspect ratio.

SUMMARY

One method of the present invention is to achieve a damage free ultra/mega-sonic cleaning on a wafer with patterned structure by maintaining a stable bubble cavitation. The stable bubble cavitation is controlled by setting a sonic power supply with power $P_1$ at a time interval shorter than $\tau_1$, and setting the sonic power supply with power $P_2$ at a time interval longer than $\tau_2$, and repeat above steps till the wafer is cleaned, where power $P_2$ is equal to zero or much smaller than power $P_1$, $\tau_1$ is a time interval that the temperature inside bubble raises to a critical implosion temperature; and $\tau_2$ is a time interval that the temperature inside bubble falls down to a temperature much lower than the critical implosion temperature.

Another method of the present invention is to achieve a damage free ultra/mega sonic cleaning on a wafer with patterned structure by maintaining a stable bubble cavitation. The stable bubble cavitation is controlled by setting a sonic power supply with frequency $f_1$ at a time interval shorter than $\tau_1$, and setting the sonic power supply with frequency $f_2$ at a time interval longer than $\tau_2$, and repeat above steps till the wafer is cleaned, where $f_2$ is much higher than $f_1$, better to be 2 times or 4 times higher, $\tau_1$ is a time interval that the temperature inside bubble raises to a critical implosion temperature; and $\tau_2$ is a time interval that the temperature inside bubble falls down to a temperature much lower than the critical implosion temperature.

Another method of the present invention is to achieve a damage free ultra/mega-sonic cleaning on a wafer with patterned structure by maintaining a stable bubble cavitation with bubble size less than space in patterned structure. The stable bubble cavitation with bubble size less than space in patterned structure is controlled by setting a sonic power supply at power $P_1$ for a time interval shorter than $\tau_1$, and setting the sonic power supply at power $P_2$ for a time interval longer than $\tau_2$, and repeat above steps till the wafer is cleaned, where $P_2$ is equal to zero or much smaller than $P_1$, $\tau_1$ is a time interval that the bubble size increases to a critical size equal to or larger than the space in patterned structures; and $\tau_2$ is a time interval that the bubble size decreases to a value much smaller than the space in patterned structure.

Another method of the present invention is to achieve a damage free ultra/mega-sonic cleaning on a wafer with patterned structure by maintaining a stable bubble cavitation with bubble size less than space in patterned structure. The stable bubble cavitation with bubble size less than space in patterned structure is controlled by setting a sonic power supply with frequency $f_1$ for a time interval shorter than $\tau_1$, and setting the sonic power supply with frequency $f_2$ for a time interval longer than $\tau_2$, and repeat above steps till the wafer is cleaned, where $f_2$ is much higher than $f_1$, better to be 2 times or 4 times higher, $\tau_1$ is a time interval that the bubble size increases to a critical size equal to or larger than the space in patterned structures; and $\tau_2$ is a time interval that the bubble size decreases to a value much smaller than the space in patterned structure.

One method of the present invention is to achieve an effective ultra/mega-sonic cleaning on a substrate with features of deep holes by maintaining a non-saturated bubble cavitation. The non-saturated bubble cavitation is controlled by setting a sonic power supply with power $P_1$ at a time interval shorter than $\tau_1$, and setting the sonic power supply with power $P_2$ at a time interval longer than $\tau_2$, and repeating above steps till the substrate is cleaned, where power $P_2$ is equal to zero or much smaller than power $P_1$, $\tau_1$ is a time interval that the cavitation or bubble density inside the deep hole raises to saturated status; and $\tau_2$ is a time interval that bubble density falls down to a level much lower than the saturated status.

Another method of the present invention is to achieve an effective ultra/mega-sonic cleaning on a substrate with features of deep holes by maintaining a non-saturated bubble cavitation. The non-saturated bubble cavitation is controlled by setting a sonic power supply with frequency $f_1$ at a time interval shorter than $\tau_1$, and setting the sonic power supply with frequency $f_2$ at a time interval longer than $\tau_2$, and repeating above steps till the substrate is cleaned, where $f_2$ is much higher than $f_1$, better to be 2 times or 4 times higher, $\tau_1$ is a time interval that the cavitation or bubble density inside the deep hole raises to saturated status; and $\tau_2$ is a time interval that bubble density falls down to a level much lower than the saturated status.

One method of the present invention is to achieve an effective ultra/mega-sonic cleaning on a substrate with features of deep holes by maintaining a certain size of bubble in cavitation status. The certain size of bubble in cavitation status is controlled by setting a sonic power supply with power $P_1$ at a time interval shorter than $\tau_1$, and setting the sonic power supply with power $P_2$ at a time interval longer than $\tau_2$, and repeating above steps till the substrate is cleaned, where power $P_2$ is equal to zero or much smaller than power $P_1$, $\tau_1$ is a time interval that the cavitation or bubble density inside the deep hole raises to saturated status; and $\tau_2$ is a time interval that bubble size falls down to a level much smaller than the certain size.

Another method of the present invention is to achieve an effective ultra/mega-sonic cleaning on a substrate with features of deep holes by maintaining a certain size of bubble in cavitation status. The certain size of bubble in cavitation status is controlled by setting a sonic power supply with frequency $f_1$ at a time interval shorter than $\tau_1$, and setting the sonic power supply with frequency $f_2$ at a time interval longer than $\tau_2$, and repeating above steps till the substrate is cleaned, where $f_2$ is much higher than $f_1$, better to be 2 times or 4 times higher, $\tau_1$ is a time interval that the cavitation or bubble density inside the deep hole raises to saturated status; and $\tau_2$ is a time interval that bubble size falls down to a level much smaller than the certain size.

BRIEF DESCRIPTION OF THE DRAWINGS

FIGS. 4A-4B depict a transit cavitation damaging patterned structure on a wafer during cleaning process;

FIGS. 5A-5C depict thermal energy variation inside bubble during cleaning process;

FIGS. 6A-6C depict an exemplary wafer cleaning method;

FIGS. 7A-7C depict another exemplary wafer cleaning method;

FIGS. 8A-8D depict another exemplary wafer cleaning method;

FIGS. 9A-9D depict another exemplary wafer cleaning method;

FIGS. 10A-10B depict another exemplary wafer cleaning method;

FIGS. 11A-11B depict another exemplary wafer cleaning method;

FIGS. 12A-12B depict another exemplary wafer cleaning method;

FIGS. 13A-13B depict another exemplary wafer cleaning method;

FIGS. 14A-14B depict another exemplary wafer cleaning method;

FIGS. 15A-15C depict a stable cavitation damaging patterned structure on a wafer during cleaning process;

FIG. 16 depicts another exemplary wafer cleaning apparatus using ultra/mega sonic device; and FIG. 17 depicts an exemplary wafer cleaning apparatus using ultra/mega sonic device;

FIG. 20A to FIG. 20D depict bubbles in the status of below the saturation point in the feature of vias or trenches;

FIG. 20E to FIG. 20H depict the size of bubbles expanded by the ultra/mega sonic device to result in the ratio R of total bubbles volume $V_B$ to the volume of via, trench or recessed space $V_{VTR}$ being closed to or above the saturation point;

FIGS. 22A-22D depict another exemplary substrate cleaning method;

FIGS. 23A-23C depict another exemplary substrate cleaning method.

DETAILED DESCRIPTION

Figure 1A:
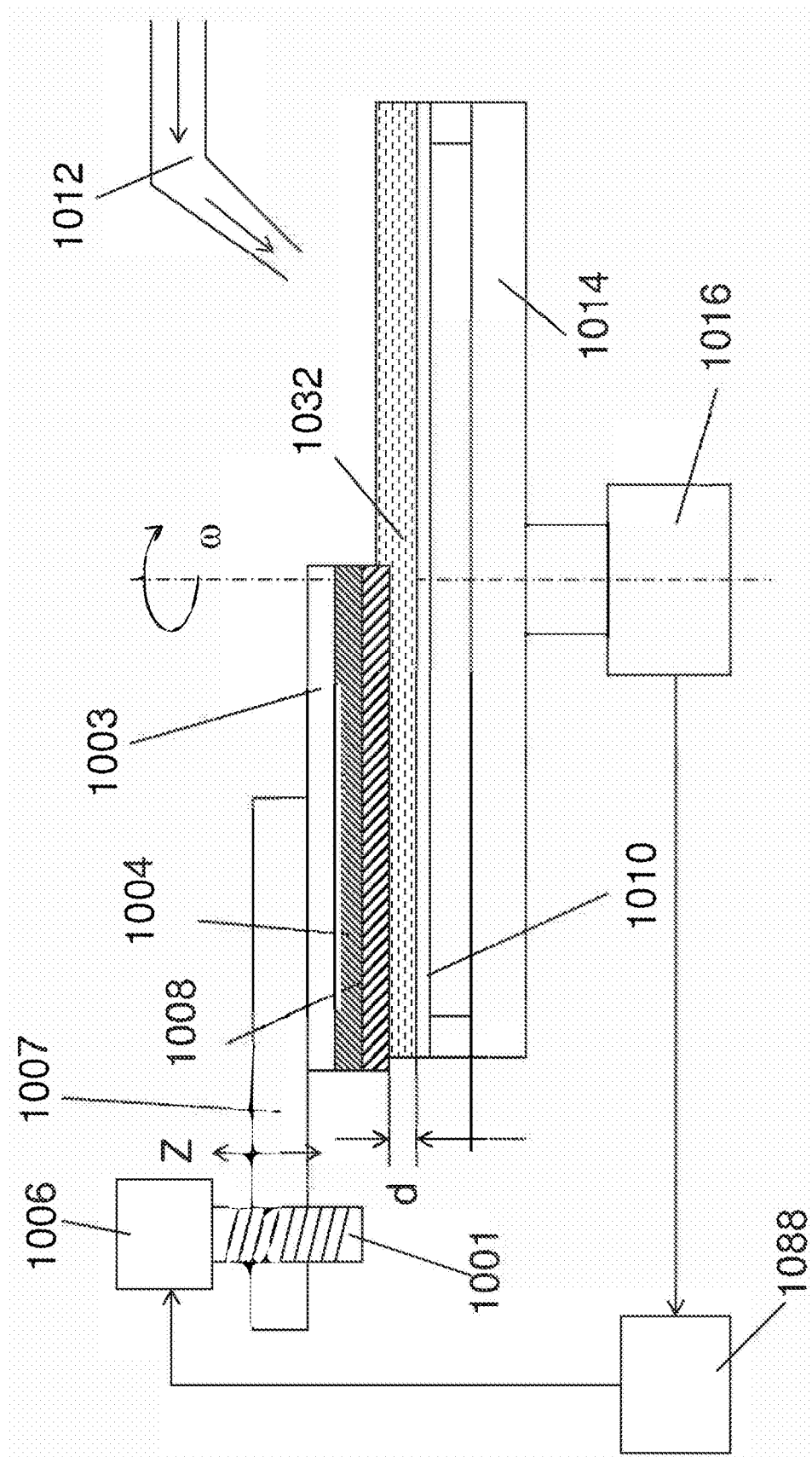
FIGS. 1A-1B depict an exemplary wafer cleaning apparatus using ultra/mega sonic device.
Figure 1B:
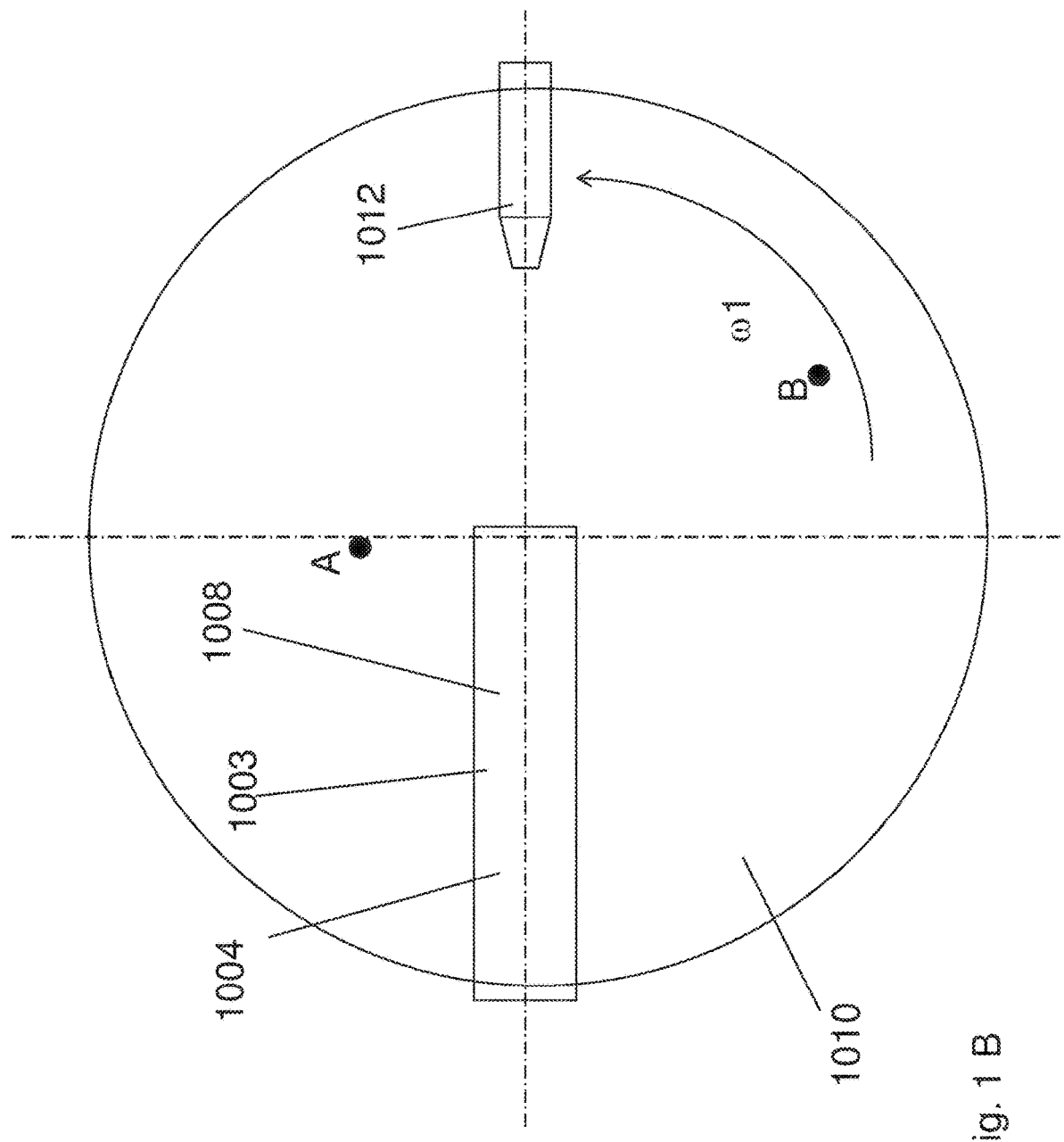

FIGS. 1A to 1B show a wafer cleaning apparatus using a ultra/mega sonic device. The wafer cleaning apparatus consists of wafer 1010, wafer chuck 1014 being rotated by rotation driving mechanism 1016, nozzle 1012 delivering cleaning chemicals or de-ionized water 1032, and ultra/mega sonic device 1003 and ultra/mega sonic power supply. The ultra/mega sonic device 1003 further consists of piezoelectric transducer 1004 acoustically coupled to resonator 1008. Transducer 1004 is electrically excited such that it vibrates and the resonator 1008 transmits high frequency sound energy into liquid. The bubble cavitation generated by the ultra/mega sonic energy oscillates particles on wafer 1010. Contaminants are thus vibrated away from the surfaces of the wafer 1010, and removed from the surfaces through the flowing liquid 1032 supplied by nozzle 1012.

Figure 2A:
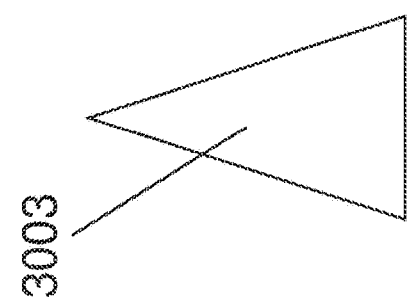
FIGS. 2A-2G depict variety of shape of ultra/mega sonic transducers.
Figure 2B:
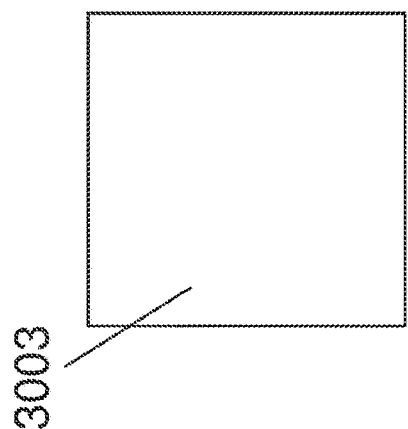
Figure 2C:
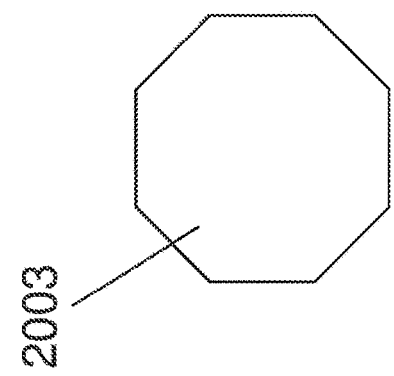
Figure 2D:
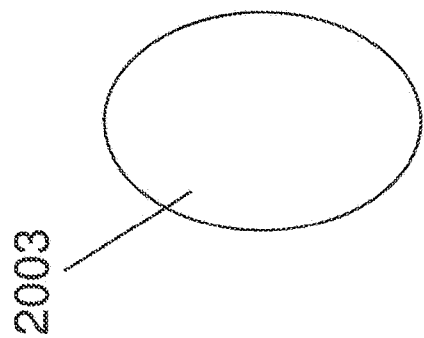
Figure 2E:
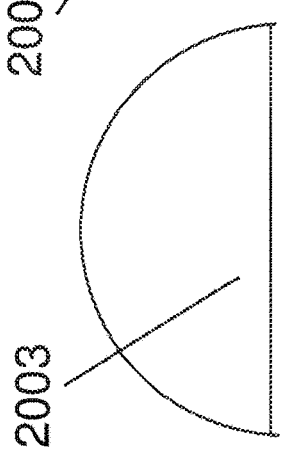
Figure 2F:
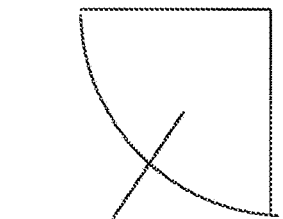
Figure 2G:
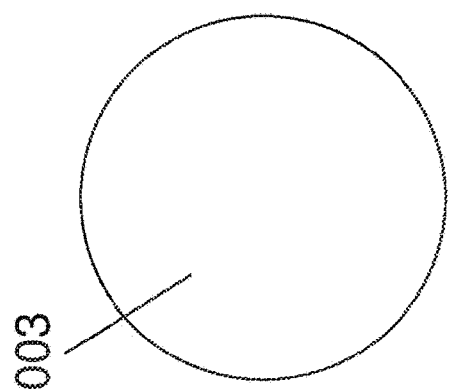

FIGS. 2A to 2G show top view of ultra/mega sonic devices according to the present invention. Ultra/mega sonic device 1003 shown in FIG. 1 can be replaced by different shape of ultra/mega sonic devices 3003, i.e. triangle or pie shape as shown in FIG. 2A, rectangle as shown in FIG. 2B, octagon as shown in FIG. 2C, elliptical as shown in FIG. 2D, half circle as shown in FIG. 2E, quarter circle as shown in FIG. 2F, and circle as shown in FIG. 2G.

Figure 3:
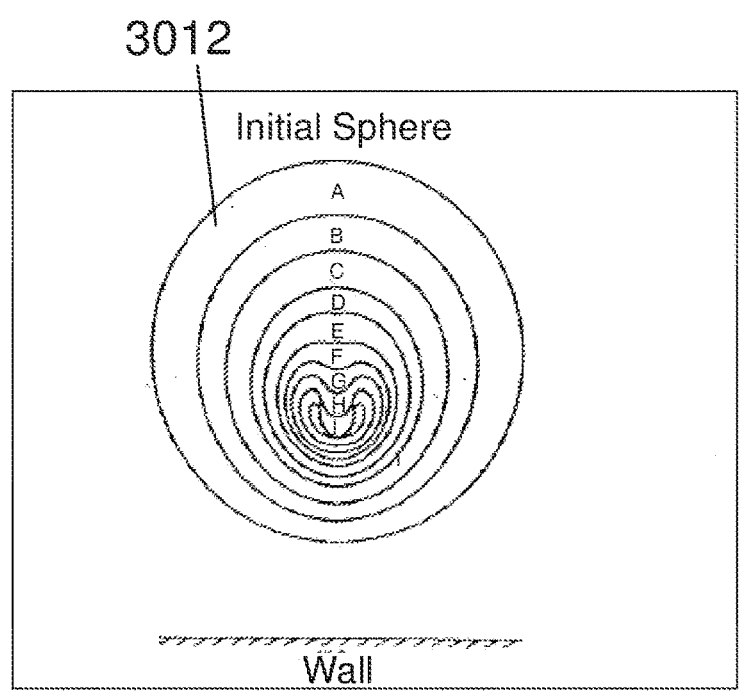
FIG. 3 depicts bubble cavitation during wafer cleaning process.

FIG. 3 shows a bubble cavitation during compression phase. The shape of bubbler is gradually compressed from a spherical shape A to an apple shape G, finally the bubble reaches to an implosion status I and forms a micro jet. As shown in FIGS. 4A and 4B, the micro jet is very violent (can reaches a few thousands atmospheric pressures and a few thousands ° C.), which can damage the fine patterned structure 4034 on the semiconductor wafer 4010, especially when the feature size t shrinks to 70 nm and smaller.

FIGS. 5A to 5C show simplified model of bubble cavitation according to the present invention. As sonic positive pressure acting on the bubble, the bubble reduces its volume. During this volume shrinking process, the sonic pressure $P_M$ did a work to the bubble, and the mechanical work converts to thermal energy inside the bubble, therefore temperature of gas and/or vapor inside bubble increases.

The idea gas equation can be expressed as follows:

$$p_0 v_0/T_0 = pv/T \quad (1),$$

where, $p_0$ is pressure inside bubbler before compression, $v_0$ initial volume of bubble before compression, $T_0$ temperature of gas inside bubbler before compression, p is pressure inside bubbler in compression, v volume of bubble in compression, T temperature of gas inside bubbler in compression.

In order to simplify the calculation, assuming the temperature of gas is no change during the compression or compression is very slow and temperature increase is cancelled by liquid surrounding the bubble. So that the mechanical work $w_m$ did by sonic pressure $P_M$ during one time of bubbler compression (from volume N unit to volume 1 unit or compression ratio=N) can be expressed as follows:

$$w_m = \int_0^{x_0-1} pS\,dx = \int_0^{x_0-1} (S(x_0 p_0)/(x_0 - x))\,dx = Sx_0 p_0 \int_0^{x_0-1} dx/(x_0 - x) = -Sx_0 p_0 \ln(x_0 - x)\big|_0^{x_0-1} = Sx_0 p_0 \ln(x_0) \quad (2)$$

Where, S is area of cross section of cylinder, $x_0$ the length of the cylinder, $p_0$ pressure of gas inside cylinder before compression. The equation (2) does not consider the factor of temperature increase during the compression, so that the actual pressure inside bubble will be higher due to temperature increase. Therefore the actual mechanical work conducted by sonic pressure will be larger than that calculated by equation (2).

If assuming all mechanical work did by sonic pressure is partially converted to thermal energy and partially converted mechanical energy of high pressure gas and vapor inside bubble, and such thermal energy is fully contributed to temperature increase of gas inside of bubbler (no energy transferred to liquid molecules surrounding the bubble), and assuming the mass of gas inside bubble staying constant before and after compression, then temperature increase $\Delta T$ after one time of compression of bubble can be expressed in the following formula:

$$\Delta T = Q/(mc) = \beta w_m/(mc) = \beta S x_0 p_0 \ln(x_0)/(mc) \quad (3)$$

where, Q is thermal energy converted from mechanical work, $\beta$ ratio of thermal energy to total mechanical works did by sonic pressure, m mass of gas inside the bubble, c gas specific heat coefficient. Substituting $\beta=0.65$, $S=1E-12\ m^2$, $x_0=1000\ \mu m=1E-3\ m$ (compression ratio N=1000), $p_0=1\ kg/cm^2=1E4\ kg/m^2$, $m=8.9E-17\ kg$ for hydrogen gas, $c=9.9E3\ J/(kg\ °\ k)$ into equation (3), then $\Delta T=50.9°\ k$.

The temperature $T_1$ of gas inside bubbler after first time compression can be calculated as $$T_1 = T_0 + \Delta T = 20°\ C. + 50.9°\ C. = 70.9°\ C. \quad (4)$$

When the bubble reaches the minimum size of 1 micron as shown in FIG. 5B. At such a high temperature, of cause some liquid molecules surrounding bubble will evaporate. After then, the sonic pressure become negative and bubble starts to increase its size. In this reverse process, the hot gas and vapor with pressure $P_G$ will do work to the surrounding liquid surface. At the same time, the sonic pressure $P_M$ is pulling bubble to expansion direction as shown in FIG. 5C, therefore the negative sonic pressure $P_M$ also do partial work to the surrounding liquid too. As the results of the joint efforts, the thermal energy inside bubble cannot be fully released or converted to mechanical energy, therefore the temperature of gas inside bubble cannot cool down to original gas temperature $T_0$ or the liquid temperature. After the first cycle of cavitation finishes, the temperature $T_2$ of gas in bubble will be somewhere between $T_0$ and $T_1$ as shown in FIG. 6B. Or $T_2$ can be expressed as $$T_2 = T1 - \delta T = T_0 + \Delta T - \delta T \quad (5)$$

Where $\delta T$ is temperature decrease after one time of expansion of the bubble, and $\delta T$ is smaller than $\Delta T$.

When the second cycle of bubble cavitation reaches the minimum bubble size, the temperature T3 of gas and or vapor inside bubbler will be $$T3 = T2 + \Delta T = T_0 + \Delta T - \delta T + \Delta T = T_0 + 2\Delta T - \delta T \quad (6)$$

When the second cycle of bubble cavitation finishes, the temperature T4 of gas and/or vapor inside bubbler will be $$T4 = T3 - \delta T = T_0 + 2\Delta T - \delta T - \delta T = T_0 + 2\Delta T - 2\delta T \quad (7)$$

Similarly, when the nth cycle of bubble cavitation reaches the minimum bubble size, the temperature $T_{2n-1}$ of gas and or vapor inside bubbler will be $$T_{2n-1} = T_0 + n\Delta T - (n-1)\delta T \quad (8)$$

When the nth cycle of bubble cavitation finishes, the temperature $T_{2n}$ of gas and/or vapor inside bubbler will be $$T_{2n} = T_0 + n\Delta T - n\delta T = T_0 + n(\Delta T - \delta T) \quad (9)$$

As cycle number n of bubble cavitation increase, the temperature of gas and vapor will increase, therefore more molecules on bubble surface will evaporate into inside of bubble 6082 and size of bubble 6082 will increase too, as shown in FIG. 6C. Finally the temperature inside bubble during compression will reach implosion temperature $T_i$ (normally $T_i$ is as high as a few thousands ° C.), and violent micro jet 6080 forms as shown in FIG. 6C.

From equation (8), implosion cycle number $n_i$ can be written as following:

$$n_i = (T_i - T_0 - \Delta T)/(\Delta T - \delta T) + 1 \quad (10)$$

From equation (10), implosion time $\tau_i$, can be written as following:

$$\tau_i = n_i t_1 = t_1((T_i - T_0 - \Delta T)/(\Delta T - \delta T) + 1) = \quad (11)$$
$$n_i/f_1 = ((T_i - T_0 - \Delta T)/(\Delta T - \delta T) + 1)/f_1$$

Where, $t_1$ is cycle period, and $f_1$ frequency of ultra/mega sonic wave.

According to formulas (10) and (11), implosion cycle number $n_i$ and implosion time $\tau_i$, can be calculated. Table 1 shows calculated relationships among implosion cycle number $n_i$, implosion time $\tau_i$ and $(\Delta T - \delta T)$, assuming Ti=3000° C., $\Delta T$=50.9° C., $T_0$=20° C., $f_1$=500 KHz, $f_1$=1 MHz, and $f_1$=2 MHz.

TABLE 1

| $\Delta T - \delta T$ (° C.) | 0.1 | 1 | 10 | 30 | 50 |
|---|---|---|---|---|---|
| $n_i$ | 29018 | 2903 | 291 | 98 | 59 |
| $\tau_i$ (ms) $f_1$ = 500 KHz | 58.036 | 5.806 | 0.582 | 0.196 | 0.118 |
| $\tau_i$ (ms) $f_1$ = 1 MHz | 29.018 | 2.903 | 0.291 | 0.098 | 0.059 |
| $\tau_i$ (ms) $f_1$ = 2 MHz | 14.509 | 1.451 | 0.145 | 0.049 | 0.029 |

In order to avoid damage to patterned structure on wafer, a stable cavitation must be maintained, and the bubble implosion or micro jet must be avoided. FIGS. 7A to 7C shows a method to achieve a damage free ultra or mega-sonic cleaning on a wafer with patterned structure by maintaining a stable bubble cavitation according to the present invention. FIG. 7A shows waveform of power supply outputs, and FIG. 7B shows the temperature curve corresponding to each cycle of cavitation, and FIG. 7C shows the bubble size expansion during each cycle of cavitation. Operation process steps to avoid bubble implosion according to the present invention are disclosed as follows:

Step 1: Put ultra/mega sonic device adjacent to surface of wafer or substrate set on a chuck or tank;

Step 2: Fill chemical liquid or gas (hydrogen, nitrogen, oxygen, or $CO_2$) doped water between wafer and the ultra/mega sonic device;

Step 3: Rotate chuck or oscillate wafer;

Step 4: Set power supply at frequency $f_1$ and power $P_1$;

Step 5: Before temperature of gas and vapor inside bubble reaches implosion temperature $T_i$, (or time reach $\tau_1 < \tau_i$ as being calculated by equation (11)), set power supply output to zero watts, therefore the temperature of gas inside bubble start to cool down since the temperature of liquid or water is much lower than gas temperature.

Step 6: After temperature of gas inside bubble decreases to room temperature $T_0$ or time (zero power time) reaches $\tau_2$, set power supply at frequency $f_1$ and power $P_1$ again.

Step 7: repeat Step 1 to Step 6 until wafer is cleaned.

In step 5, the time $\tau_1$ must be shorter than $\tau_i$ in order to avoid bubble implosion, and $\tau_i$ can be calculated by using equation (11).

In step 6, the temperature of gas inside bubble is not necessary to be cooled down to room temperature or liquid temperature; it can be certain temperature above room temperature or liquid temperature, but better to be significantly lower than implosion temperature $T_i$.

According to equations 8 and 9, if $(\Delta T - \delta T)$ can be known, the can be calculated. But in general, $(\Delta T - \delta T)$ is not easy to be calculated or measured directly. The following method can determine the implosion time $\tau_i$ experimentally.

Step 1: Based on Table 1, choosing 5 different time $\tau_1$ as design of experiment (DOE) conditions, Step 2: choose time $\tau_2$ at least 10 times of $\tau_1$, better to be 100 times of $\tau_1$ at the first screen test Step 3: fix certain power $P_0$ to run above five conditions cleaning on specific patterned structure wafer separately. Here, $P_0$ is the power at which the patterned structures on wafer will be surely damaged when running on continuous mode (non-pulse mode).

Step 4: Inspect the damage status of above five wafers by SEMS or wafer pattern damage review tool such as AMAT SEM vision or Hitachi IS3000, and then the implosion time can be located in certain range.

Step 1 to 4 can be repeated again to narrow down the range of implosion time $\tau_i$. After knowing the implosion time $\tau_i$, the time $\tau_1$ can be set at a value smaller than $0.5\tau_i$ for safety margin. One example of experimental data is described as following.

The patterned structures are 55 nm poly-silicon gate lines. Ultra/mega sonic wave frequency was 1 MHz, and ultra/mega-sonic device manufactured by Prosys was used and operated in a gap oscillation mode (disclosed by PCT/CN2008/073471) for achieving better uniform energy dose within wafer and wafer to wafer. Other experimental parameters and final pattern damage data are summarized in Table 2 as follows:

TABLE 2

| Wafer ID | $CO_2$ conc. (18 μs/cm) | Process Time (sec) | Power Density (Watts/cm2) | Cycle Number | $\tau_1$ (ms) | $\tau_2$ (ms) | Number of Damage Sites |
|---|---|---|---|---|---|---|---|
| #1 | 18 | 60 | 0.1 | 2000 | 2 | 18 | 1216 |
| #2 | 18 | 60 | 0.1 | 100 | 0.1 | 0.9 | 0 |

It was clear that the $\tau_i$=2 ms (or 2000 cycle number) introduced as many as 1216 damage sites to patterned structure with 55 nm feature size, but that the $\tau_i$=0.1 ms (or 100 cycle number) introduced zero (0) damage sites to patterned structure with 55 nm feature size. So that the $\tau_i$ is some number between 0.1 ms and 2 ms, more detail tests need to be done to narrow its range. Obviously, the cycle number related to ultra or mega sonic power density and frequency, the larger the power density, the less the cycle number; and the lower the frequency, the less the cycle number. From above experimental results, we can predict that the damage-free cycle number should be smaller than 2,000, assuming the power density of ultra or mega sonic wave is larger than 0.1 wattsorcm², and frequency of ultra or mega sonic wave is equal to or less than 1 MHz. If the frequency increases to a range larger than 1 MHz or power density is less than than 0.1 watts/cm², it can be predicted that the cycle number will increase.

After knowing the time $\tau_1$, then the time $T_2$ can be shorten based on similar DEO method described above, i.e. fix time $\tau_1$, gradually shorten the time $\tau_2$ to run DOE till damage on patterned structure being observed. As the time $\tau_2$ is shorten, the temperature of gas and or vapor inside bubbler cannot be cooled down enough, which will gradually shift average temperature of gas and vapor inside bubbler up, eventually it will trigger implosion of bubble. This trigger time is called critical cooling time. After knowing critical cooling time $\tau_c$, the time $\tau_2$ can be set at value larger than $2\tau_c$ for the same reason to gain safety margin.

FIGS. 8A to 8D show another embodiment of wafer cleaning method using a ultra/mega sonic device according to the present invention. The method is similar to that shown in FIG. 7A, except in step 4 setting ultra/mega sonic power supply at frequency $f_1$ and power with changing amplitude of waveform. FIG. 8A shows another cleaning method of setting ultra/mega sonic power at frequency $f_1$ and power with increasing amplitude of waveform in step 4. FIG. 8B shows another cleaning method of setting ultra/mega sonic power supply at frequency $f_1$ and power with decreasing amplitude of waveform in step 4. FIG. 8C shows another cleaning method of setting ultra/mega sonic power supply at frequency $f_1$ and power with decreasing first and increasing later amplitude of waveform in step 4. FIG. 8D shows further another cleaning method of setting ultra/mega sonic power at frequency $f_1$ and power with increasing first and decreasing later amplitude of waveform in step 4.

FIGS. 9A to 9D show another embodiment of wafer cleaning method using a ultra/mega sonic device according to the present invention. The method is similar to that shown in FIG. 7A, except in step 4 setting ultra/mega sonic power supply at changing frequency. FIG. 9A shows another cleaning method of setting ultra/mega sonic power supply at frequency $f_1$ first then frequency $f_3$ later, $f_1$ is higher than $f_3$ in step 4. FIG. 9B shows another cleaning method of setting ultra/mega sonic power supply at frequency $f_3$ first then frequency $f_1$ later, $f_1$ is higher than $f_3$ in step 4. FIG. 9C shows another cleaning method of setting ultra/mega sonic power supply at frequency $f_3$ first, frequency $f_1$ later and $f_3$ last, $f_1$ is higher than $f_3$ in step 4. FIG. 9D shows another cleaning method of setting ultra/mega sonic power supply at frequency $f_1$ first, frequency $f_3$ later and $f_1$ last, $f_1$ is higher than $f_3$ in step 4.

Similar to method shown in FIG. 9C, the ultra/mega sonic power can be set at frequency $f_1$ first, at frequency $f_3$ later and at frequency $f_4$ at last in step 4, where $f_4$ is smaller than $f_3$, and $f_3$ is smaller than $f_1$.

Again similar to method shown in FIG. 9C, the ultra/mega sonic power can be set at frequency $f_4$ first, at frequency $f_3$ later and at frequency $f_1$ at last in step 4, where $f_4$ is smaller than $f_3$, and $f_3$ is smaller than $f_1$ Again similar to method shown in FIG. 9C, the ultra/mega sonic power can be set at frequency $f_1$ first, at frequency $f_4$ later and at frequency $f_3$ at last in step 4, where $f_4$ is smaller than $f_3$, and $f_3$ is smaller than $f_1$.

Again similar to method shown in FIG. 9C, the ultra/mega sonic power can be set at frequency $f_3$ first, at frequency $f_4$ later and at frequency $f_1$ at last in step 4, where $f_4$ is smaller than $f_3$, and $f_3$ is smaller than $f_1$.

Again similar to method shown in FIG. 9C, the ultra/mega sonic power can be set at frequency $f_3$ first, at frequency $f_1$ later and at frequency $f_4$ at last in step 4, where $f_4$ is smaller than $f_3$, and $f_3$ is smaller than $f_1$.

Again similar to method shown in FIG. 9C, the ultra/mega sonic power can be set at frequency $f_4$ first, at frequency $f_1$ later and at frequency $f_3$ at last in step 4, where $f_4$ is smaller than $f_3$, and $f_3$ is smaller than $f_1$.

FIGS. 10A to 10B show another method to achieve a damage free ultra/mega-sonic cleaning on a wafer with patterned structure by maintaining a stable bubble cavitation in according to the present invention. FIG. 10A shows waveform of power supply outputs, and FIG. 10B shows the temperature curve corresponding to each cycle of cavitation. Operation process steps according to the present invention are disclosed as follows:

Step 1: Put ultra/mega sonic device adjacent to surface of wafer or substrate set on a chuck or tank;

Step 2: Fill chemical liquid or gas doped water between wafer and the ultra/mega sonic device;

Step 3: Rotate chuck or oscillate wafer;

Step 4: Set power supply at frequency $f_1$ and power $P_1$;

Step 5: Before temperature of gas and vapor inside bubble reaches implosion temperature $T_i$, (total time $\tau_1$ elapes), set power supply output at frequency $f_1$ and power $P_2$, and $P_2$ is smaller than $P_1$. Therefore the temperature of gas inside bubble start to cool down since the temperature of liquid or water is much lower than gas temperature.

Step 6: After temperature of gas inside bubble decreases to certain temperature close to room temperature $T_0$ or time (zero power time) reach $\tau_2$, set power supply at frequency $f_1$ and power $P_1$ again.

Step 7: repeat Step 1 to Step 6 until wafer is cleaned.

In step 6, the temperature of gas inside bubble can not be cooled down to room temperature due to power $P_2$, there should be a temperature difference $\Delta T_2$ existing in later stage of $\tau_2$ time zone, as shown in FIG. 10B.

FIGS. 11A to 11B show another embodiment of wafer cleaning method using a ultra/mega sonic device according to the present invention. The method is similar to that shown in FIG. 10A, except in step 5 setting ultra/mega sonic power at frequency $f_2$ and power $P_2$, where $f_2$ is lower than $f_1$ and $P_2$ is less than $P_1$. Since $f_2$ is lower than $f_1$, the temperature of gas or vapor inside bubble increasing faster, therefore the P2 should be set significantly less than P1, better to be 5 or 10 times less in order to reduce temperature of gas and or vapor inside bubble.

FIGS. 12A to 12B show another embodiment of wafer cleaning method using a ultra/mega sonic device according to the present invention. The method is similar to that shown in FIG. 10A, except in step 5 setting ultra/mega sonic power at frequency $f_2$ and power $P_2$, where $f_2$ is higher than $f_1$, and $P_2$ is equal to $P_1$.

FIGS. 13A to 13B show another embodiment of wafer cleaning method using a ultra/mega sonic device according to the present invention. The method is similar to that shown in FIG. 10A, except in step 5 setting ultra/mega sonic power at frequency $f_2$ and power $P_2$, where $f_2$ is higher than $f_1$, and $P_2$ is less than $P_1$.

FIGS. 14A-14B shows another embodiment of wafer cleaning method using a ultra/mega sonic device according to the present invention. The method is similar to that shown in FIG. 10A, except in step 5 setting ultra/mega sonic power at frequency $f_2$ and power $P_2$, where $f_2$ is higher than $f_1$, and $P_2$ is higher than $P_1$. Since $f_2$ is higher than $f_1$, the temperature of gas or vapor inside bubble increasing slower, therefore the P2 can be slightly higher than P1, but must make sure the temperature of gas and vapor inside bubbler decreases in time zone $\tau_2$ comparing to temperature zone $\tau_1$, as shown in FIG. 14B

FIGS. 4A and 4B show that patterned structure is damaged by the violent micro jet. FIGS. 15A and 15B show that the stable cavitation can also damage the patterned structure on wafer. As bubble cavitation continues, the temperature of gas and vapor inside bubble increases, therefore size of bubble 15046 also increases as shown in FIG. 15A. When size of bubble 15048 becomes larger than dimension of space W in patterned structure as shown in FIG. 15B, the expansion force of bubble cavitation can damage the patterned structure 15034 as shown in FIG. 15C. Another cleaning method according to the present invention are disclosed as follows:

Step 1: Put ultra/mega sonic device adjacent to surface of wafer or substrate set on a chuck or tank;

Step 2: Fill chemical liquid or gas doped water between wafer and the ultra/mega sonic device;

Step 3: Rotate chuck or oscillate wafer;

Step 4: Set power supply at frequency $f_1$ and power $P_1$;

Step 5: Before size of bubble reaches the same dimension of space W in patterned structures (time $\tau_1$ elapse), set power supply output to zero watts, therefore the temperature of gas inside bubble starts to cool down since the temperature of liquid or water is much lower than gas temperature;

Step 6: After temperature of gas inside bubble continues to reduce (either it reaches room temperature $T_0$ or time (zero power time) reach $\tau_2$, set power supply at frequency $f_1$ power $P_1$ again;

Step 7: repeat Step 1 to Step 6 until wafer is cleaned;

In step 6, the temperature of gas inside bubble is not necessary to be cooled down to room temperature, it can be any temperature, but better to be significantly lower than implosion temperature $T_i$. In the step 5, bubble size can be slightly larger than dimension of patterned structures as long as bubble expansion force does not break or damage the patterned structure. The time $\tau_1$ can be determined experimentally by using the following method:

Step 1: Similar to Table 1, choosing 5 different time $\tau_1$ as design of experiment (DOE) conditions, Step 2: choose time $\tau_2$ at least 10 times of $\tau_1$, better to be 100 times of $\tau_1$ at the first screen test Step 3: fix certain power $P_0$ to run above five conditions cleaning on specific patterned structure wafer separately. Here, $P_0$ is the power at which the patterned structures on wafer will be surely damaged when running on continuous mode (non-pulse mode).

Step 4: Inspect the damage status of above five wafers by SEMS or wafer pattern damage review tool such as AMAT SEM vision or Hitachi IS3000, and then the damage time $\tau_i$ can be located in certain range.

Step 1 to 4 can be repeated again to narrow down the range of damage time $\tau_d$. After knowing the damage time $\tau_d$, the time $\tau_1$ can be set at a value smaller than $0.5 \tau_d$ for safety margin.

All cleaning methods described from FIG. 7 to FIG. 14 can be applied in or combined with the method described in FIG. 15.

FIG. 16 shows a wafer cleaning apparatus using a ultra/mega sonic device. The wafer cleaning apparatus consists of wafer 16010, wafer chuck 16014 being rotated by rotation driving mechanism 16016, nozzle 16064 delivering cleaning chemicals or de-ionized water 16060, ultra/mega sonic device 16062 coupled with nozzle 16064, and ultra/mega sonic power supply. Ultra/mega sonic wave generated by ultra/mega sonic device 16062 is transferred to wafer through chemical or water liquid column 16060. All cleaning methods described from FIG. 7 to FIG. 15 can be used in cleaning apparatus described in FIG. 16.

FIG. 17 shows a wafer cleaning apparatus using a ultra/mega sonic device. The wafer cleaning apparatus consists of wafers 17010, a cleaning tank 17074, a wafer cassette 17076 holding the wafers 17010 and being held in the cleaning tank 17074, cleaning chemicals 17070, a ultra/mega sonic device 17072 attached to outside wall of the cleaning tank 17074, and a ultra/mega sonic power supply. At least one inlet fills the cleaning chemicals 17070 into the cleaning tank 17074 to immerse the wafers 17010. All cleaning methods described from FIG. 7 to FIG. 15 can be used in cleaning apparatus described in FIG. 17.

Figure 18A:
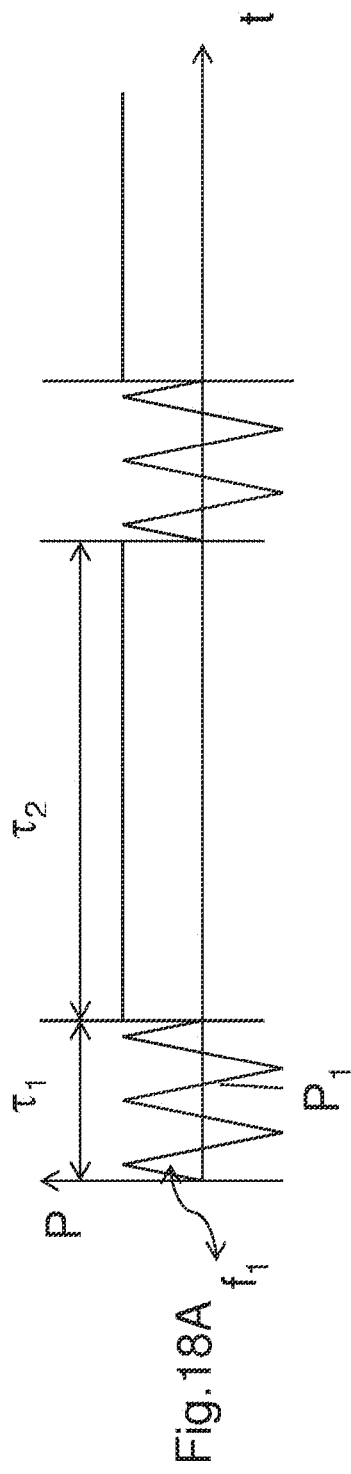
FIGS. 18A-18C depict another exemplary wafer cleaning method.
Figure 18B:
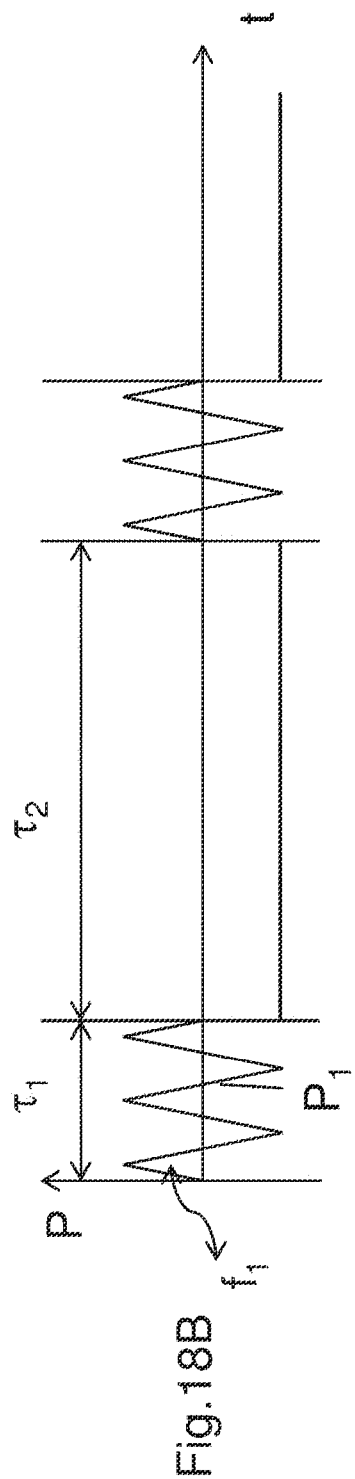
Figure 18C:
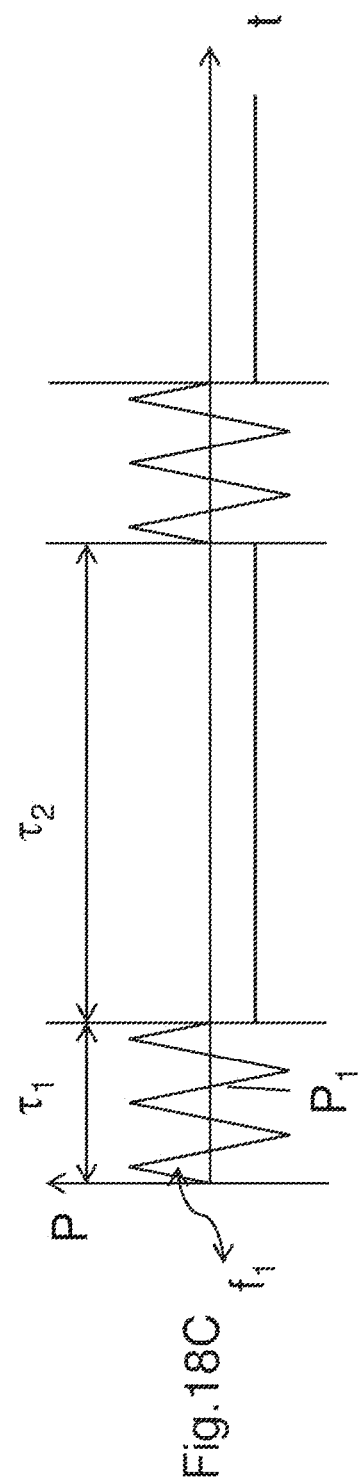

FIGS. 18A to 18C show another embodiment of wafer cleaning method using a ultra/mega sonic device according to the present invention. The method is similar to that shown in FIG. 7A, except in Step 5: Before temperature of gas and vapor inside bubble reaches implosion temperature $T_i$, (or time reach $\tau_1 < \tau_i$ as being calculated by equation (11)), set power supply output to a positive value or negative DC value to hold or stop ultra/mega sonic device to vibrate, therefore the temperature of gas inside bubble start to cool down since the temperature of liquid or water is much lower than gas temperature. The positive value of negative value can be bigger, equal to or smaller than power $P_1$.

Figure 19:
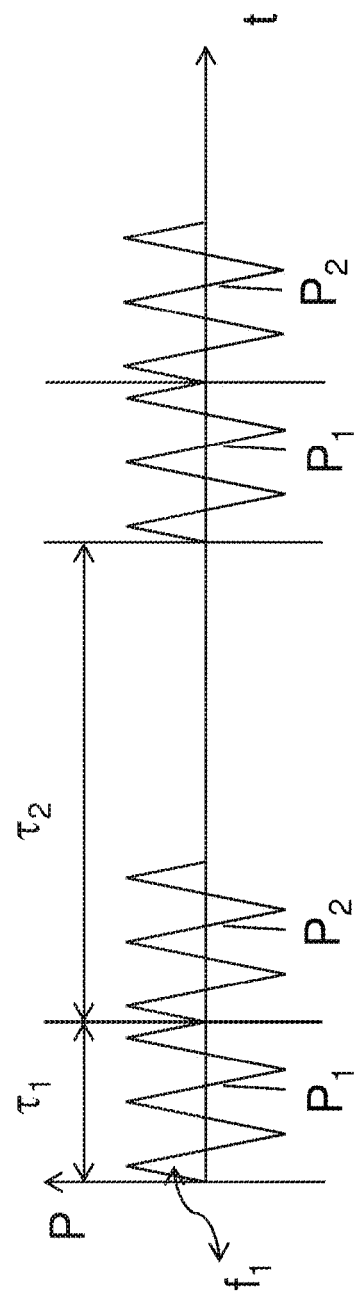
FIG. 19 depicts another exemplary wafer cleaning method.

FIG. 19 shows another embodiment of wafer cleaning method using a ultra/mega sonic device according to the present invention. The method is similar to that shown in FIG. 7A, except in Step 5: Before temperature of gas and vapor inside bubble reaches implosion temperature $T_i$, (or time reach $\tau_1 < \tau_i$ as being calculated by equation (11)), set power supply output at the frequency same as $f_1$ with reverse phase to $f_1$ to quickly stop the cavitation of bubble. Therefore the temperature of gas inside bubble start to cool down since the temperature of liquid or water is much lower than gas temperature. The positive value of negative value can be bigger, equal or less than power $P_1$. During above operation, the power supply output can be set at a frequency different from frequency $f_1$ with reverse phase to $f_1$ in order to quickly stop the cavitation of bubble.

As shown in FIG. 20A to FIG. 20D, the bubbles 20012 are in the status of below the saturation point in the feature of vias 20034 or trenches 20036 on a substrate 20010, so as to increase the fresh chemical exchange in the vias 20034 or trenches 20036 due to the bubble cavitation inside the features and also increase the removal of impurities such as residues and particles from the features. The saturation point $R_s$ is defined by the largest amount of bubbles inside the features of vias, trenches or recessed areas. Over the saturation point, the chemical liquid is blocked by the bubbles inside the feature and hardly reaches to the bottom or side walls of the features of vias and trenches, so that the cleaning performance of the chemical liquid is influenced. While below the saturation point, the chemical liquid has enough feasibility inside the features of vias or trenches, and a good cleaning performance is achieved.

Below the saturation point, the ratio R of total bubbles volume $V_B$ to the volume of via or trench, or recessed space $V_{VTR}$ is:

$$R = V_B / V_{VTR} < R_s$$

And at or above the saturation point $R_s$, the ratio R of total bubbles volume $V_B$ to the volume of via or trench, or recessed space $V_{VTR}$ is:

$$R = V_B / V_{VTR} = R_s$$

The volume of the total bubbles in the features of vias, trenches or recessed space: $V_B = N v_b$ Wherein N is the total bubble numbers in the features and $v_b$ is averaged single bubble volume.

As shown in FIG. 20E to FIG. 20H, the size of bubble 20012 expanded by the ultra/mega sonic device is gradually to a certain volume, which results in the ratio R of total bubbles volume $V_B$ to the volume of via, trench or recessed space $V_{VTR}$ is closed to or above the saturation point $R_s$. It leads to the expanded bubble 20012 blocking in the vias or trenches, where is the path of chemical exchanges and impurities removal. In the case, the megasonic power cannot thoroughly transfer into the vias or trenches to reach their bottom and sidewall, meanwhile, the particles, residues and other impurities 20048 trapped in the vias or trenches cannot go out efficiently. This case easily occurs as the critical dimension W1 decreasing smaller, and the bubbles in the features of vias and trenches intends to be saturated after being expanded.

Figure 20I:
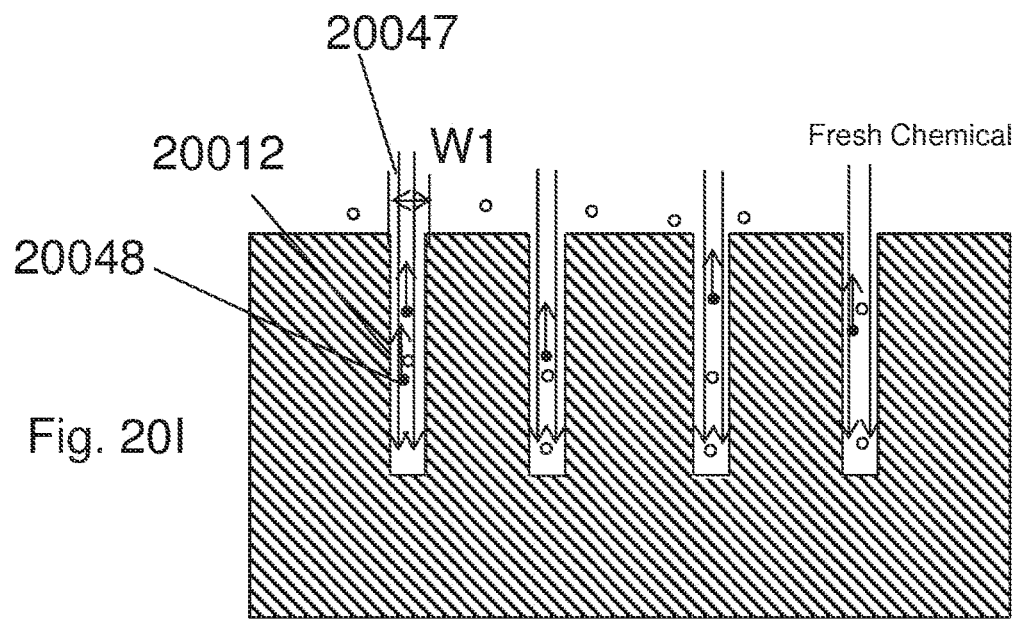
FIG. 20I and FIG. 20J depict the size of bubbles expanded by the ultra/mega sonic device within a limitation to result in the ratio R of total bubbles volume $V_B$ to the volume of via, trench or recessed space $V_{VTR}$ being much below the saturation point.
Figure 20J:
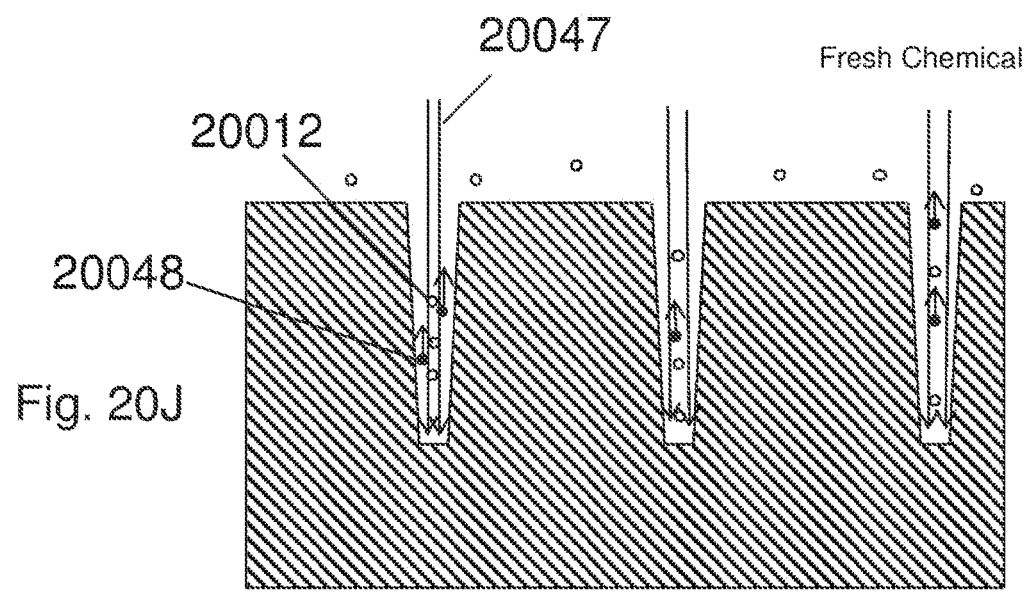

As shown in FIG. 20I to FIG. 20J, the size of bubble 20012 is expanded by the ultra/mega sonic device within a limitation, and the ratio R of total bubbles volume $V_B$ to the volume of via, trench or recessed space $V_{VTR}$ is much below the saturation point. The fresh chemical 20047 exchanges freely in the vias or trenches due to the bubble cavitation inside the features to achieve a good cleaning performance, meanwhile, the impurities 20048 such as residues and particles go out of the features of vias, trenches and recessed space.

Due to the total bubbles in the features is related to the bubble numbers and the bubble size in the features of vias and treches, the control of bubble size expanded by the cavitation is critical for the cleaning performance in the high aspect ratio features cleaning process.

Figure 21A:
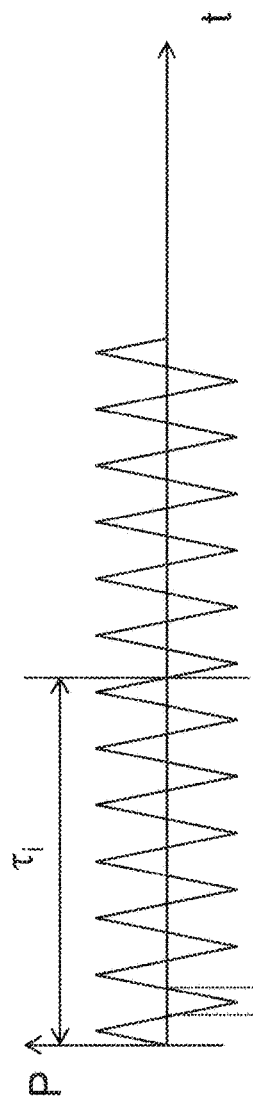
FIGS. 21A-21D depict an exemplary substrate cleaning method.
Figure 21B:
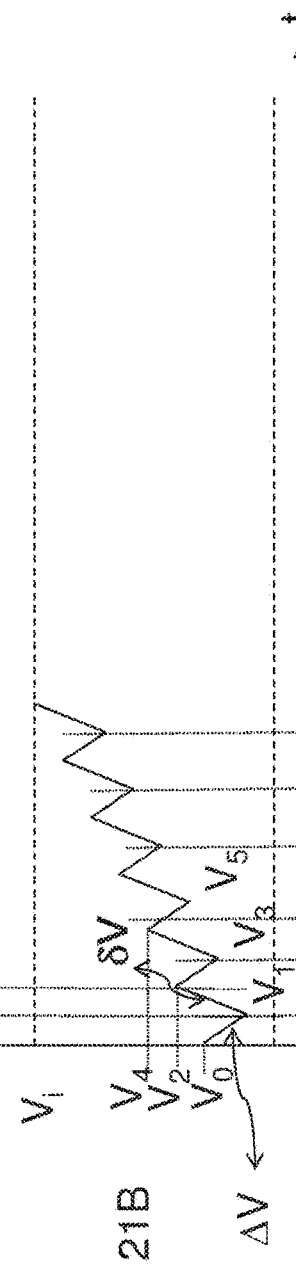
Figure 21C:
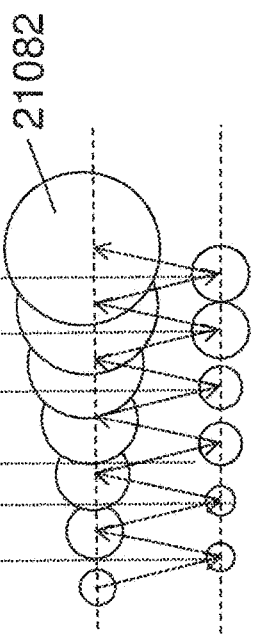

As shown in FIG. 21A to FIG. 21D, after the first cycle of cavitation finishes, the volume of $V_1$ of gas in bubble is compressed to a minimum size smaller than $V_0$ during positive sonic power working on it, and the volume of $V_2$ of gas in bubble will be returned back during the negative sonic power working on it. However, the temperature $T_2$ in the bubble with the volume of $V_2$ is higher than the temperature $T_0$ in the bubble with the volume of $V_0$, as shown in FIG. 21B, so that the volume of $V_2$ is bigger than the volume of $V_0$ due to some liquid molecules surrounding bubble will evaporate under the high temperature. And the volume of $V_3$ by the second compression of the bubble is somewhere between $V_1$ and $V_2$, as shown in FIG. 21B. And $V_1$, $V_2$ and $V_3$ can be expressed as $$V_1 = V_0 - \Delta V \tag{12}$$

$$V_2 = V_1 + \delta V \tag{13}$$

$$V_3 = V_2 - \Delta V = V_1 + \delta V - \Delta V = V_0 - \Delta V + \delta V - \Delta V = V_0 + \delta V - 2\Delta V \tag{14}$$

Where $\Delta V$ is volume compression of bubble after one time of compression due to positive pressure generated by ultra/mega sonic wave, and $\delta V$ is volume increase of the bubble after one time of expansion due to negative pressure generated by ultra/mega sonic wave, and $\delta V - \Delta V$ is volume increase due to temperature increment $\Delta T - \delta T$ as calculated in equation (5) after one time cycle.

After the second cycle of bubble cavitation, the size of bubble reaches to the larger bubble size during the temperature keeping increasing, the volume of $V_4$ of gas and or vapor inside bubbler will be $$V_4 = V_3 + \delta V = V_0 + \delta V - 2\Delta V + \delta V = V_0 + 2(\delta V - \Delta V) \tag{15}$$

When the third cycle of bubble cavitation, the volume $V_5$ of gas and/or vapor inside bubbler will be $$V_5 = V_4 - \Delta V = V_0 + 2(\delta V - \Delta V) - \Delta V = V_0 + 2\delta V - 3\Delta V \tag{16}$$

Similarly, when the nth cycle of bubble cavitation reaches the minimum bubble size, the volume $V_{2n-1}$ of gas and or vapor inside bubbler will be $$V_{2n-1} = V_0 + (n-1)\delta V - n\Delta V = V_0 + (n-1)\delta V - n\Delta V \tag{17}$$

When the nth cycle of bubble cavitation finishes, the volume $V_{2n}$ of gas and/or vapor inside bubbler will be $$V_{2n} = V_0 + n(\delta V - \Delta V) \tag{18}$$

To restrict the volume of bubble into a desired volume $V_i$, which is a dimension with enough physical feasibility of movement or the bubbles status below the saturation point of cavitation or bubble density, rather than blocking the path of the chemical exchange in the features of vias, trenches or recessed areas, the cycle number $n_i$ can be written as following:

$$n_i = (V_i - V_0 - \Delta V)/(\delta V - \Delta V) + 1 \tag{19}$$

From equation (19), the desired time $\tau_i$ to achieve the $V_i$ can be written as following:

$$\tau_i = n_i t_1 = t_1((V_i - V_0 - \Delta V)/(\delta V - \Delta V) + 1) = \\ n_i/f_1 = ((V_i - V_0 - \Delta T)/(\delta V - \Delta V) + 1)/f_1 \tag{20}$$

Where, $t_1$ is cycle period, and $f_1$ frequency of ultra/mega sonic wave.

According to formulas (19) and (20), a desired cycle number $n_i$ and a time $\tau_i$ to restrict the bubble dimension can be calculated.

Figure 21D:
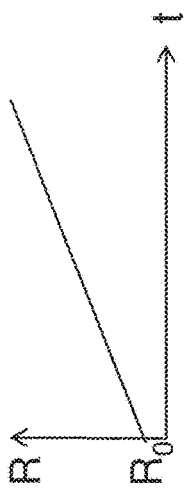

It should be pointed that when the cycle number n of bubble cavitation increases, the temperature of gas and liquid (water) vapor inside bubbler will increase, therefore more molecules on bubble surface will evaporate into inside of bubble, therefore the size of bubble 21082 will further increase and be bigger than value calculated by equation (18). In practical operation, since the bubble size will be determined by experimental method to be disclosed later, therefore bubble size impacted by the evaporation of liquid or water for bubble inner surface due to temperature increase will not be theoretically discussed in detail here. As the average single bubble volume keeping increasing, the ratio R of total bubbles volume $V_B$ to the volume of via, trench or recessed space $V_{VTR}$ increases from $R_0$ continuously, as shown in FIG. 21D.

As the bubble volume increases, the diameter of bubble eventually will reach the same size or same order size of feature W1 such as via as shown in FIG. 20E and trench or recessed area as shown in FIG. 20G. Then the bubble inside via and trench will block ultra/mega sonic energy further get into the bottom of via and trench, especially when the aspect ratio (depth/width) is larger than 3 time or more. Therefore contaminations or particles at bottom of such deep via or trench cannot be effectively removed or cleaned.

In order to avoid the bubble growth up to a critical dimension to block the path of chemical exchanges in the features of vias or trenches, FIGS. 22A to 22D disclose a method to achieve an effective ultra/mega sonic cleaning on a substrate with high aspect ratio features of vias or trenches by maintaining a restricted size bubble cavitation according to the present invention. FIG. 22A shows waveform of power supply outputs, and FIG. 22B shows the bubble volume curve corresponding to each cycle of cavitation, and FIG. 22C shows the bubble size expansion during each cycle of cavitation, and FIG. 22D shows the curve of the ratio R of total bubbles volume $V_B$ to the volume of via, trench or recessed space $V_{VTR}$. According to $$R = V_B/V_{VTR} = Nv_b/V_{VTR},$$

the ratio R of total bubbles volume $V_B$ to the volume of via, trench or recessed space $V_{VTR}$ increases from $R_0$ to $R_n$, where the average single bubble volume being expanded by the sonic cavitation after a certain cycle number n, in the time of $\tau_1$. And the $R_n$ is controlled below the saturation point $R_s$, $$R_n = V_B/V_{VTR} = Nv_b/V_{VTR} < Rs.$$

And the ratio R of total bubbles volume $V_B$ to the volume of via, trench or recessed space $V_{VTR}$ decreases from $R_n$ to $R_0$, where the average single bubble volume return to original size in the cooling process in the time of $\tau_2$.

Operation process steps to avoid bubble size growth up according to the present invention are disclosed as follows:

Step 1: Put ultra/mega sonic device adjacent to surface of substrate or substrate set on a chuck or tank;

Step 2: Fill chemical liquid or gas (hydrogen, nitrogen, oxygen, or $CO_2$) doped water between substrate and the ultra/mega sonic device;

Step 3: Rotate chuck or oscillate substrate;

Step 4: Set power supply at frequency $f_1$ and power $P_1$;

Step 5: After the volume of bubble expands to a certain volume $V_n$ or diameter w, (or time reach $\tau_1$), set power supply output to zero watts, therefore the volume of gas inside bubble start to shrink down since the temperature of liquid or water cooling down the gas temperature;

Step 6: After the volume of bubble decreases to original volume while the gas temperature decreasing to room temperature $T_0$ or time (zero power time) reaches $\tau_2$, set power supply at frequency $f_1$ and power $P_1$ again;

Step 7: repeat Step 1 to Step 6 until substrate is cleaned.

In step 5, the expanded bubble's volume of $V_n$ or diameter w is not necessary to be restricted to be smaller than the dimension $V_i$ or feature size w1 that blocking the features of vias or trenches. It can be certain volume above the $V_i$, but better to be smaller than the dimension $V_i$ in order to obtain an effective cleaning with shortest process time. And the $\tau_1$ is also not necessary to be restricted to be smaller than $\tau_i$, but better to be smaller than the $\tau_i$ as being defined in the equation (20).

In step 6, the volume of bubble is not necessary to shrink down to an original volume. It can be certain volume above original volume, but better to be significantly smaller than the $V_i$ to restrict bubble size to get ultra/mega sonic power to be transmitted to the bottom of features such as via, trench, or recessed area.

FIG. 22B shows that the bubble is expanded into a big volume $V_n$ by the ultra/mega sonic power working on it during a time $\tau_1$. At this state, the path of mass transfer is partially blocked. And then the fresh chemical cannot thoroughly transfer into the vias or trenches to reach their bottom and sidewall, meanwhile, the particles, residues and other impurities trapped in the vias or trenches cannot go out efficiently. But the state will alternate into the next state for bubble shrinking: when the ultra/mega sonic power is off for cooling the bubble during a time $\tau_2$ as shown in FIG. 22A. In this cooling state, the fresh chemical has chance to transfer into the vias or trenches so as to clean their bottom and sidewall. When the ultra/mega sonic power is on in the next on cycle, the particles, residues and other impurities can be removed out of the vias or trenches by pull out force generated by bubble volume increment. If the two states are alternating in a cleaning process, it achieves a performance of an effective ultra/mega sonic cleaning on a substrate with high aspect ratio features of vias or trenches or recessed areas.

The cooling state in the time $\tau_2$ plays a key role in this cleaning process. It should be defined precisely. And the $\tau1 < \tau_i$ time to restrict bubble size, is desired, and the definition of $\tau_i$ also is preferred. The following method can determine the time $\tau_2$ to shrink bubble size during a cooling down state and time $\tau_1$ to restrict the bubble expanded to the blockage size experimentally. The experiment is done by using an ultra/mega sonic device coupling with a chemical liquid to clean a pattern substrate with small features of vias and trenches, where the traceable residues exist to evaluate the cleaning performance.

Step 1: choose a $\tau_1$ which is big enough to block the features, which can be calculation as $\tau_i$ based on the equation (20).

Step 2: choose different time $\tau_2$ to run DOE. The selection of time $\tau_2$ is at least 10 times of $\tau_1$, better to be 100 times of $\tau_1$ at the first screen test.

Step 3: Fix time $\tau_1$ and fix certain power $P_0$ to run at least five conditions cleaning on specific patterned structure substrate separately. Here, $P_0$ is the power at which the features of vias or trenches on substrate will be surely not cleaned when running on continuous mode (non-pulse mode).

Step 4: Inspect the traceable residues status inside the features of vias or trenches of above five substrates by SEMS or element analyzer tool such as EDX.

The step 1 to step 4 can be repeated again to gradually shorten the time $\tau_2$ till the traceable residues inside the features of vias or trenches are observed. As the time $\tau_2$ shorten, the volume of bubble cannot shrink down enough, which will gradually block the features and influence the cleaning performance. This time is called critical cooling time $\tau_c$. After knowing critical cooling time $\tau_c$, the time $\tau_2$ can be set at value larger than $2\tau_c$ to gain safety margin.

A more detail example is shown as follows:

Step 1: choosing 10 different time $\tau_1$ as design of experiment (DOE) conditions, such as $\tau_{10}$, $2\tau_{10}$, $4\tau_{10}$, $8\tau_{10}$, $16\tau_{10}$, $32\tau_{10}$, $64\tau_{10}$, $128\tau_{10}$, $256\tau_{10}$, $512\tau_{10}$, as shown in Table 3;

Step 2: choosing time $\tau_2$ at least 10 times of $512\tau_{10}$, better to be 20 times of $512\tau_{10}$ at the first screen test, as shown in Table 3;

Step 3: fixing certain power $P_0$ to run above ten conditions cleaning on specific patterned structure substrate separately. Here, $P_0$ is the power at which the features of vias or trenches on substrate will be surely not cleaned when running on continuous mode (non-pulse mode).

TABLE 3

| Substrate# | 1 | 2 | 3 | 4 | 5 | 6 | 7 | 8 | 9 | 10 |
|---|---|---|---|---|---|---|---|---|---|---|
| $\tau_1$ | $\tau_{10}$ | $2\tau_{10}$ | $4\tau_{10}$ | $8\tau_{10}$ | $16\tau_{10}$ | $32\tau_{10}$ | $64\tau_{10}$ | $128\tau_{10}$ | $256\tau_{10}$ | $512\tau_{10}$ |
| $\tau_2$ | $5120\tau_{10}$ | $5120\tau_{10}$ | $5120\tau_{10}$ | $5120\tau_{10}$ | $5120\tau_{10}$ | $5120\tau_{10}$ | $5120\tau_{10}$ | $5120\tau_{10}$ | $5120\tau_{10}$ | $5120\tau_{10}$ |
| Power | P0 | P0 | P0 | P0 | P0 | P0 | P0 | P0 | P0 | P0 |
| Process Time | $T_0$ | $T_0$ | $T_0$ | $T_0$ | $T_0$ | $T_0$ | $T_0$ | $T_0$ | $T_0$ | $T_0$ |
| Clean Status of Features | 1 | 2 | 3 | 4 | 5 | 6 | 5 | 4 | 4 | 3 |

Step 4: Using above conditions as shown in Table 3 to process 10 substrates with features of vias or trenches post plasma etching. The reason to choose the post plasma etched substrate is that the polymers generated during etching process are formed on sidewall of trench and via. Those polymers formed on the bottom or side wall of via are difficulty to remove by a conventional method. Then inspect the cleaning status of features of vias or trenches on the ten substrates by SEMS with crossing section of substrates. The data are shown in Table 3. From the Table 3, the cleaning effect reaches the best point of 6 at $\tau_1=32\tau_{10}$, therefore the optimum time $\tau_1$ is $32\tau_{10}$.

If there is no peak to be found, then the step 1 to step 4 with board time setting of $\tau_1$ can be repeated again to find the time $\tau_1$. After find the initial $\tau_1$, then step 1 to step 4 with time setting close to $\tau_1$ can be repeated again to narrow down the range of time After knowing the time $\tau_i$, the time $\tau_2$ can be optimized by reducing the time $\tau_2$ from 512 $\tau_2$ to a value till the cleaning effect is reduced. A detail procedure is disclosed as follows Table 4:

TABLE 4

| Substrate# | 1 | 2 | 3 | 4 | 5 | 6 | 7 | 8 |
|---|---|---|---|---|---|---|---|---|
| $\tau_1$ | $32\tau_{10}$ | $32\tau_{10}$ | $32\tau_{10}$ | $32\tau_{10}$ | $32\tau_{10}$ | $32\tau_{10}$ | $32\tau_{10}$ | $32\tau_{10}$ |
| $\tau_2$ | $4096\tau_{10}$ | $2048\tau_{10}$ | $1024\tau_{10}$ | $512\tau_{10}$ | $256\tau_{10}$ | $128\tau_{10}$ | $64\tau_{10}$ | $32\tau_{10}$ |
| Power | P0 | P0 | P0 | P0 | P0 | P0 | P0 | P0 |
| Process Time | $T_0$ | $T_0$ | $T_0$ | $T_0$ | $T_0$ | $T_0$ | $T_0$ | $T_0$ |
| Clean Status of Features | 3 | 4 | 5 | 6 | 7 | 6 | 5 | 3 |

From the Table 4, the cleaning effect reaches the best point of 7 at $\tau_2=256\tau_{10}$, therefore the optimum time $\tau_2$ is $256\tau_{10}$.

FIGS. 23A to 23C show another embodiment of substrate cleaning method using a ultra/mega sonic device according to the present invention. The method is similar to that shown in FIGS. 22A to 22D, except that power is still on for period of $m\tau_1$ even the cavitation reaches a saturation point Rs. Here, m can be number from 0.1 to 100, preferred 2, which is depending on via and trench structure and chemicals, and it need to be optimized by experiment explained in embodiment as FIGS. 22A to 22D.

Method and apparatus disclosed in FIG. 8 to FIG. 14, and FIG. 16 to FIG. 19 can be applied in embodiments as shown in FIG. 22 and FIG. 23, it will not be described here again.

Generally speaking, an ultra/mega sonic wave with the frequency between 0.1 MHz~10 MHz may be applied to the method disclosed in the present invention.

As described above, the present invention discloses a method for effectively cleaning vias, trenches or recessed areas on a substrate using ultra/mega sonic device, comprising: applying liquid into a space between a substrate and an ultra/mega sonic device; setting an ultra/mega sonic power supply at frequency $f_1$ and power $P_1$ to drive said ultra/mega sonic device; after the ratio of total bubbles volume to volume inside vias, trenches or recessed areas on the substrate increasing to a first set value, setting said ultra/mega sonic power supply at frequency $f_2$ and power $P_2$ to drive said ultra/mega sonic device; after the ratio of total bubbles volume to volume inside the vias, trenches or recessed areas reducing to a second set value, setting said ultra/mega sonic power supply at frequency $f_1$ and power $P_1$ again; repeating above steps till the substrate being cleaned.

The first set value is below the cavitation saturation point. The second set value is much lower than the cavitation saturate point. The temperature inside bubble cooling down results in the ratio of total bubbles volume to volume inside the vias, trenches or recessed areas reducing to the second set value. The temperature inside bubble cooling down to near temperature of said liquid.

At above embodiment, the first set value is a cavitation saturation point, and even after the ratio of total bubbles volume to volume inside vias, trenches or recessed areas on the substrate reaches to the cavitation saturation point, the ultra/mega sonic power supply is still kept at frequency $f_1$ and power $P_1$ for period of $m\tau_1$, here $\tau_1$ is the time to reach the cavitation saturation point, m is multiples of $\tau_1$, which is a number between 0.1 to 100, preferred 2.

According to an embodiment, the present invention discloses an apparatus for effectively cleaning vias, trenches or recessed areas on a substrate using an ultra/mega sonic device. The apparatus includes a chuck, an ultra/mega sonic device, at least one nozzle, an ultra/mega sonic power supply and a controller. The chuck holds a substrate. The ultra/mega sonic device is positioned adjacent to the substrate. The at least one nozzle injects chemical liquid on the substrate and a gap between the substrate and the ultra/mega sonic device. The controller sets the ultra/mega sonic power supply at frequency $f_1$ and power $P_1$ to drive the ultra/mega sonic device; after the ratio of total bubbles volume to volume inside vias, trenches or recessed areas on the substrate increasing to a first set value, the controller setting the ultra/mega sonic power supply at frequency $f_2$ and power $P_2$ to drive the ultra/mega sonic device; after the ratio of total bubbles volume to volume inside the vias, trenches or recessed areas reducing to a second set value, the controller setting the ultra/mega sonic power supply at frequency $f_1$ and power $P_1$ again; repeating above steps till the substrate being cleaned.

According to another embodiment, the present invention discloses an apparatus for effectively cleaning vias, trenches or recessed areas on a substrate using an ultra/mega sonic device. The apparatus includes a cassette, a tank, an ultra/mega sonic device, at least one inlet, an ultra/mega sonic power supply and a controller. The cassette holds at least one substrate. The tank holds the cassette. The ultra/mega sonic device is attached to outside wall of the tank. At least one inlet is used for filling chemical liquid into the tank to immerse the substrate. The controller sets the ultra/mega sonic power supply at frequency $f_1$ and power $P_1$ to drive the ultra/mega sonic device; after the ratio of total bubbles volume to volume inside vias, trenches or recessed areas on the substrate increasing to a first set value, the controller setting the ultra/mega sonic power supply at frequency $f_2$ and power $P_2$ to drive the ultra/mega sonic device; after the ratio of total bubbles volume to volume inside the vias, trenches or recessed areas reducing to a second set value, the controller setting the ultra/mega sonic power supply at frequency $f_1$ and power $P_1$ again; repeating above steps till the substrate being cleaned.

According to another embodiment, the present invention discloses an apparatus for effectively cleaning vias, trenches or recessed areas on a substrate using an ultra/mega sonic device. The apparatus includes a chuck, an ultra/mega sonic device, a nozzle, an ultra/mega sonic power supply and a controller. The chuck holds a substrate. The ultra/mega sonic device coupled with a nozzle is positioned adjacent to substrate. The nozzle injects chemical liquid on the substrate. The controller sets the ultra/mega sonic power supply at frequency $f_1$ and power $P_1$ to drive the ultra/mega sonic device; after the ratio of total bubbles volume to volume inside vias, trenches or recessed areas on the substrate increasing to a first set value, the controller setting the ultra/mega sonic power supply at frequency $f_2$ and power $P_2$ to drive the ultra/mega sonic device; after the ratio of total bubbles volume to volume inside the vias, trenches or recessed areas reducing to a second set value, the controller setting the ultra/mega sonic power supply at frequency $f_1$ and power $P_1$ again; repeating above steps till the substrate being cleaned.

Although the present invention has been described with respect to certain embodiments, examples, and applications, it will be apparent to those skilled in the art that various modifications and changes may be made without departing from the invention.

What is claimed is:

1. An apparatus for cleaning a semiconductor wafer comprising features of patterned structures, the apparatus comprising:
   a wafer holder configured to hold the semiconductor wafer;
   an inlet configured to apply liquid on the semiconductor wafer;
   a transducer configured to deliver acoustic energy to the liquid;
   a power supply of the transducer; and
   a controller for the power supply comprising a timer, the controller being configured to control the transducer based on the timer to:
      deliver acoustic energy to the liquid at a first frequency value and a first power level value for a predetermined first time period, wherein sizes of bubbles inside the features increase during the first time period, and
      deliver acoustic energy to the liquid at a second frequency value and a second power level value for a predetermined second time period, wherein sizes of bubbles inside the features decrease during the second time period,
      wherein the controller is configured to alternately apply the first and second time periods one after another for a predetermined number of cycles, and wherein the first time period and the second time period are determined based on a ration (R) of total bubble volume ($V_B$) to volume ($V_{VTR}$) inside vias, trenches, or recessed areas on the semiconductor wafer.

2. The apparatus of claim 1, wherein the wafer holder comprises a rotating chuck.

3. The apparatus of claim 1, wherein the wafer holder comprises a cassette submerged in a cleaning tank.

4. The apparatus of claim 1, wherein the inlet comprises a nozzle.

5. The apparatus of claim 1, wherein the transducer is connected to the inlet and imparts acoustic energy to the liquid flowing through the inlet.

6. The apparatus of claim 1, wherein the first time period is determined as a time period that achieves the highest number of cleaned features.

7. The apparatus of claim 1, wherein the second time period is determined as a time period that achieves the highest number of cleaned features.

8. The apparatus of claim 1, wherein the first time period ends prior to at least one of the features being blocked by the bubbles.

9. The apparatus of claim 1, wherein the first time period ends after at least one of the features being blocked by the bubbles.

10. The apparatus of claim 1, wherein the second power level value is lower than the first power level value.

11. The apparatus of claim 10, wherein the second power level value is zero.

12. The apparatus of claim 1, wherein the second frequency value is higher than the first frequency value.

13. The apparatus of claim 1, wherein acoustic energy in the second time period is in antiphase to acoustic energy in the first time period.

14. The apparatus of claim 1, wherein the first frequency value is equal to the second frequency value, while the first power level value is higher than the second power level value.

15. The apparatus of claim 1, wherein the first frequency value is higher than the second frequency value, while the first power level value is higher than the second power level value.

16. The apparatus of claim 1, wherein the first frequency value is lower than the second frequency value, while the first power level value is equal to the second power level value.

17. The apparatus of claim 1, wherein the first frequency value is lower than the second frequency value, while the first power level value is higher than the second power level value.

18. The apparatus of claim 1, wherein the first frequency value is lower than the second frequency value, while the first power level value is lower than the second power level value.

19. The apparatus of claim 1, wherein the first power level value rises during the first time period.

20. The apparatus of claim 1, wherein the first power level value falls during the first time period.

21. The apparatus of claim 1, wherein the first power level value both rises and falls during the first time period.

22. The apparatus of claim 1, wherein the first frequency value changes from a higher value to a lower value during the first time period.

23. The apparatus of claim 1, wherein the first frequency value changes from a lower value to a higher value during the first time period.

24. The apparatus of claim 1, wherein the first frequency value changes from a lower value to a higher value and then back to the lower value during the first time period.

25. The apparatus of claim 1, wherein the first frequency value changes from a higher value to a lower value and then back to the higher value during the first time period.

26. The apparatus of claim 1, wherein the first frequency value is set as $f_1$ first, $f_3$ later and fa at last during the first time period, where $f_4$ is smaller than $f_3$, and $f_3$ is smaller than $f_1$.

27. The apparatus of claim 1, wherein the first frequency value is set as $f_4$ first, $f_3$ later and $f_1$ at last during the first time period, where $f_4$ is smaller than $f_3$, and $f_3$ is smaller than $f_1$.

28. The apparatus of claim 1, wherein the first frequency value is set as $f_1$ first, $f_4$ later and $f_3$ at last during the first time period, where $f_4$ is smaller than $f_3$, and $f_3$ is smaller than $f_1$.

29. The apparatus of claim 1, wherein the first frequency value is set as $f_3$ first, $f_4$ later and $f_1$ at last during the first time period, where $f_4$ is smaller than $f_3$, and $f_3$ is smaller than $f_1$.

30. The apparatus of claim 1, wherein the first frequency value is set as $f_3$ first, $f_1$ later and $f_4$ at last during the first time period, where $f_4$ is smaller than $f_3$, and $f_3$ is smaller than $f_1$.

31. The apparatus of claim 1, wherein the first frequency value is set as $f_4$ first, $f_1$ later and $f_3$ at last during the first time period, where $f_4$ is smaller than $f_3$, and $f_3$ is smaller than $f_1$.

32. The apparatus of claim 1, wherein the second frequency value is zero and the second power level value remains a constant positive value during the second time period.

33. The apparatus of claim 1, wherein the second frequency value is zero and the second power level value remains a constant negative value during the second time period.

34. The apparatus of claim 1, wherein the features comprise vias or trenches having depth to width ratios of at least 3.

35. The apparatus of claim 1, wherein a device manufacturing node of the semiconductor wafer is no more than 16 nanometers.

36. The apparatus of claim 1, wherein the wafer holder is further configured to rotate the wafer with respect to the transducer as acoustic energy is delivered.

37. The apparatus of claim 1, wherein the second time period ends after a ratio of total bubble volume inside the features falls much lower than a cavitation saturation point.

38. The apparatus of claim 1, wherein the first time period ends before a ratio of total bubble volume inside the features reaches a cavitation saturation point.

39. The apparatus of claim 1, wherein the first time period ends when a ratio of total bubble volume inside the features reaches a cavitation saturation point.

40. The apparatus of claim 1, wherein a duration of the first time period is $m\tau_1$, where $\tau_1$, is a time for a ratio of total bubble volume inside the features reaches a cavitation saturation point.

41. The apparatus of claim 40, wherein m is a value between 0.1 to 100.

42. The apparatus of claim 1, wherein temperatures inside the bubbles decrease in the second time period.

43. The apparatus of claim 42, wherein temperatures inside the bubble decrease to a temperature of said liquid in the second time period.

44. The apparatus of claim 1, wherein the first time period is shorter than 2,000 times of a cycle period of the first frequency value.

45. The apparatus of claim 1, wherein the first time period is shorter than $((V_i-V_0-\Delta V)/(\Delta V-\delta V)+1)/f_1$, where $V_i$ is a desired volume, is a desired volume, $V_0$ is an original volume, $\Delta V$ is a volume compression of the bubble after one time of compression, $\delta V$ is a volume increase of the bubble after one time of expansion, and f1 is the first frequency value.

46. A controller for a power supply of a transducer comprising a timer, the controller being configured to control the transducer based on the timer to:
deliver acoustic energy to liquid applied on a semiconductor wafer at a first frequency value and a first power level value for a predetermined first time period, wherein sizes of bubbles inside features of patterned structures of the semiconductor wafer increase during the first time period; and
deliver acoustic energy to the liquid at a second frequency value and a second power level value for a predetermined second time period, wherein sizes of bubbles inside features decrease during the second time period,
wherein the controller is configured to alternately apply the first and second time periods one after another for a predetermined number of cycles, and wherein the first time period and the second time period are determined based on a ratio (R) of total bubble volume ($V_B$) to volume ($V_{VTR}$) inside vias, trenches, or recessed areas on the semiconductor wafer.

47. The controller of claim 46, wherein the first time period is determined as a time period that achieves the highest number of cleaned features.

48. The controller of claim 46, wherein the second time period is determined as a time period that achieves the highest number of cleaned on the features.

49. The controller of claim 46, wherein the first time period ends prior to at least one of the features being blocked by the bubbles.

50. The controller of claim 46, wherein the first time period ends after at least one of the features being blocked by the bubbles.

51. The controller of claim 46, wherein the second power level value is lower than the first power level.

52. The controller of claim 51, wherein the second power level value is zero.

* * * * *